(12) United States Patent
Kim et al.

(10) Patent No.: US 11,233,122 B2
(45) Date of Patent: Jan. 25, 2022

(54) SEMICONDUCTOR DEVICES

(71) Applicant: SAMSUNG ELECTRONICS CO., LTD., Suwon-si (KR)

(72) Inventors: Sangsu Kim, Yongin-si (KR); Junbeom Park, Seoul (KR); Junggil Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/943,103

(22) Filed: Jul. 30, 2020

(65) Prior Publication Data

US 2021/0217848 A1    Jul. 15, 2021

(30) Foreign Application Priority Data

Jan. 14, 2020 (KR) .................. 10-2020-0004680

(51) Int. Cl.
| | |
|---|---|
| *H01L 29/10* | (2006.01) |
| *H01L 29/786* | (2006.01) |
| *H01L 29/66* | (2006.01) |
| *H01L 29/06* | (2006.01) |
| *H01L 29/423* | (2006.01) |

(52) U.S. Cl.
CPC ...... *H01L 29/1029* (2013.01); *H01L 29/0649* (2013.01); *H01L 29/42392* (2013.01); *H01L 29/66545* (2013.01); *H01L 29/78654* (2013.01)

(58) Field of Classification Search
CPC .......... H01L 29/1029; H01L 29/78654; H01L 29/66545; H01L 29/0649; H01L 29/42392

USPC ............... 257/329, 401, 288, 369, 327, 365, 257/E29.255, E29.264, E21.409, E21.41, 257/E21.421; 438/283, 296, 299, 497, 438/197

See application file for complete search history.

(56) References Cited

U.S. PATENT DOCUMENTS

| | | | |
|---|---|---|---|
| 9,502,518 B2 | 11/2016 | Liu et al. | |
| 9,748,352 B2 | 8/2017 | Liu et al. | |
| 10,403,739 B2 * | 9/2019 | Kim | ............... H01L 29/42392 |
| 2018/0315828 A1 | 11/2018 | Yamashita et al. | |
| 2019/0006485 A1 | 1/2019 | Kim et al. | |
| 2019/0081155 A1 | 3/2019 | Xie et al. | |
| 2019/0123163 A1 | 4/2019 | Yang et al. | |
| 2019/0131415 A1 | 5/2019 | Cheng et al. | |
| 2019/0148490 A1 | 5/2019 | Fung et al. | |

(Continued)

*Primary Examiner* — Dao H Nguyen
(74) *Attorney, Agent, or Firm* — Lee IP Law, P.C.

(57) ABSTRACT

A semiconductor device including an active pattern on a substrate and extending lengthwise in a first direction parallel to an upper surface of the substrate; a gate structure on the active pattern, the gate structure extending in a second direction parallel to the upper surface of the substrate and crossing the first direction; channels spaced apart from each other along a third direction perpendicular to the upper surface of the substrate, each of the channels extending through the gate structure along the first direction; a source/drain layer on a portion of the active pattern adjacent to the gate structure in the first direction, the source/drain layer contacting the channels; inner spacers between the gate structure and the source/drain layer, the inner spacers contacting the source/drain layer; and channel connection portions between each of the inner spacers and the gate structure, the channel connection portions connecting the channels with each other.

20 Claims, 31 Drawing Sheets

(56) References Cited

U.S. PATENT DOCUMENTS

| | | |
|---|---|---|
| 2019/0198645 A1 | 6/2019 | Cheng et al. |
| 2021/0202697 A1* | 7/2021 | Young ............... H01L 29/78696 |
| 2021/0202758 A1* | 7/2021 | Yeong ............... H01L 29/66545 |
| 2021/0226066 A1* | 7/2021 | Young ............... H01L 29/42392 |

* cited by examiner

SEMICONDUCTOR DEVICES

CROSS-REFERENCE TO RELATED APPLICATION

This application claims priority under 35 U.S.C. § 119 to Korean Patent Application No. 10-2020-0004680, filed on Jan. 14, 2020, in the Korean Intellectual Property Office, and entitled: "Semiconductor Devices," is incorporated by reference herein in its entirety.

BACKGROUND

1. Field

Embodiments relate to a semiconductor device.

2. Description of the Related Art

When a multi-bridge channel field effect transistor (MBCFET) including a plurality of channels spaced apart from each other along a vertical direction (each of which extending through a gate structure in a horizontal direction) is formed, a source/drain layer commonly contacting the channels may be formed, and an inner spacer may be formed between the gate structure and the source/drain layer to electrically insulate the gate structure from the source/drain layer.

SUMMARY

The embodiments may be realized by providing a semiconductor device including an active pattern on a substrate, the active pattern extending lengthwise in a first direction parallel to an upper surface of the substrate; a gate structure on the active pattern, the gate structure extending lengthwise in a second direction parallel to the upper surface of the substrate and crossing the first direction; channels spaced apart from each other along a third direction perpendicular to the upper surface of the substrate, each of the channels extending lengthwise through the gate structure along the first direction; a source/drain layer on a portion of the active pattern adjacent to the gate structure in the first direction, the source/drain layer contacting the channels; inner spacers between the gate structure and the source/drain layer, the inner spacers contacting the source/drain layer; and channel connection portions between each of the inner spacers and the gate structure, the channel connection portions connecting the channels with each other.

The embodiments may be realized by providing a semiconductor device including an active pattern on a substrate, the active pattern extending lengthwise in a first direction parallel to an upper surface of the substrate; a gate structure on the active pattern, the gate structure extending lengthwise in a second direction parallel to the upper surface of the substrate and crossing the first direction; channels spaced apart from each other along a third direction perpendicular to the upper surface of the substrate, each of the channels extending lengthwise through the gate structure along the first direction; a source/drain layer on a portion of the active pattern portion adjacent to the gate structure in the first direction, the source/drain layer contacting the channels; and a channel connection portion and an inner spacer sequentially stacked along the first direction between the gate structure and the source/drain layer, the channel connection portion including a semiconductor material and the inner spacer including silicon nitride, wherein the gate structure includes an interface pattern, a gate insulating pattern and a gate electrode sequentially stacked along the first direction from the channel connection portion, the interface pattern including silicon oxide, the gate insulating pattern including a metal oxide, and the gate electrode including a metal.

The embodiments may be realized by providing a semiconductor device including an active pattern on a substrate, the active pattern extending lengthwise in a first direction parallel to an upper surface of the substrate; channels on the active pattern, the channels being spaced apart from each other along a third direction perpendicular to the upper surface of the substrate; a gate structure extending lengthwise on the active pattern in a second direction parallel to the upper surface of the substrate and crossing the first direction, the gate structure at least partially covering each of the channels; source/drain layers at respective opposite sides of the gate structure in the first direction, each of the source/drain layers contacting the channels; inner spacers between the active pattern and a lowermost one of the channels and between the channels, respectively, the inner spacers contacting the source/drain layers; gate spacers covering respective opposite sidewalls of a portion of the gate structure on an uppermost one of the channels; and channel connection portions between the gate structure and a corresponding one of the inner spacers, the channel connection portions connecting the active pattern and the lowermost one of the channels, and connecting the channels with each other, and the channel connection portions covering an inner sidewall, an upper surface, and a lower surface of a corresponding one of the inner spacers, wherein the gate structure includes an interface pattern, a gate insulating pattern, a gate electrode sequentially stacked from an surface of each of the channels, an upper surface of the active pattern and an inner sidewall of the channel connection portion, the interface pattern including a silicon oxide, the gate insulating pattern including a metal oxide, and the gate electrode including a metal.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, two directions substantially parallel to an upper surface of a substrate and crossing each other may be referred to as first and second directions, respectively, and a direction substantially perpendicular to the upper surface of the substrate may be referred to as a third direction. In example embodiments, the first and second directions may be substantially perpendicular to each other.

Figure 1:
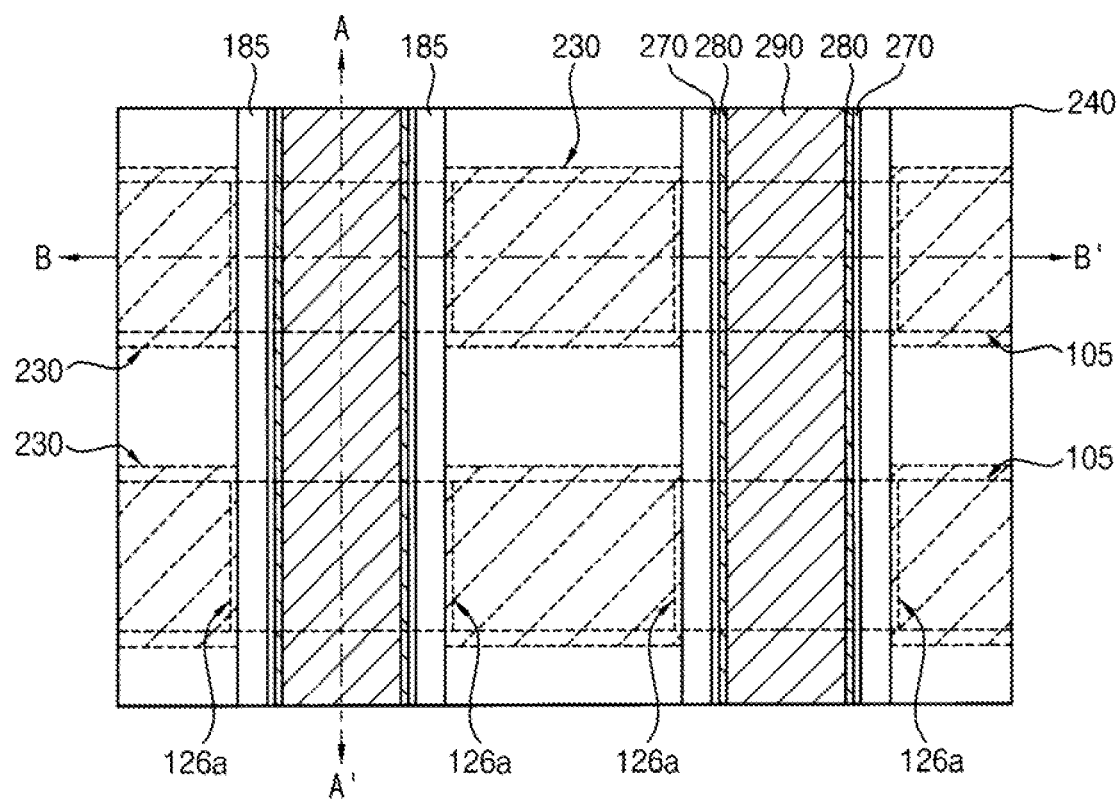
FIGS. 1 to 4 are a plan view and cross-sectional views illustrating a semiconductor device in accordance with example embodiments.
Figure 1:
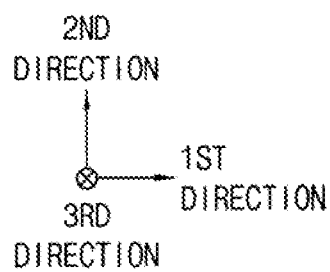
Figure 2:
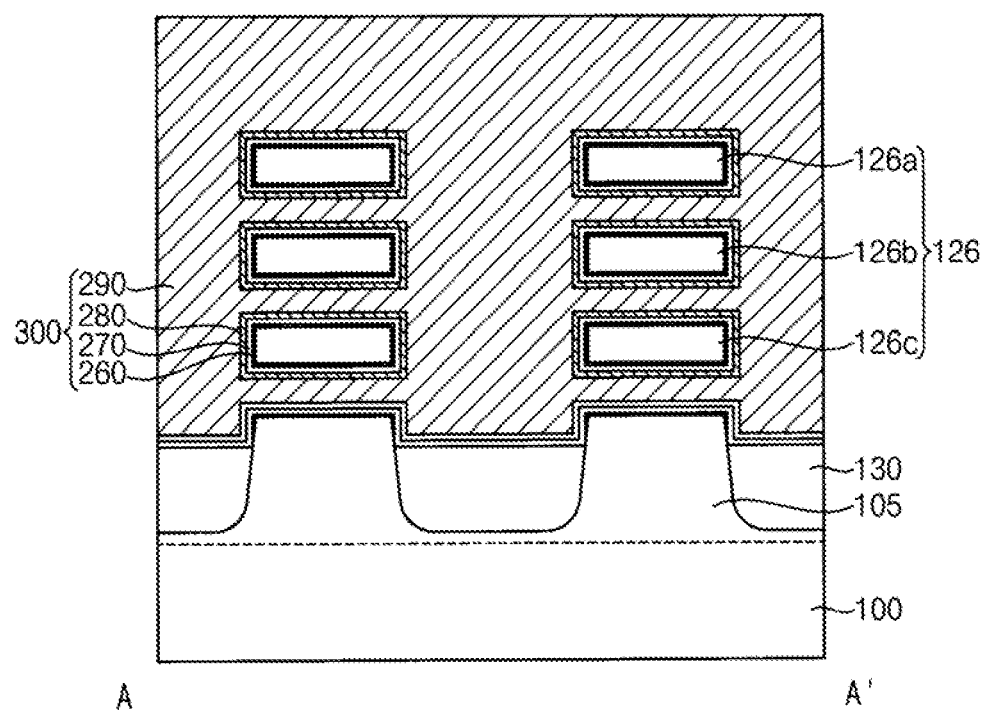
Figure 3:
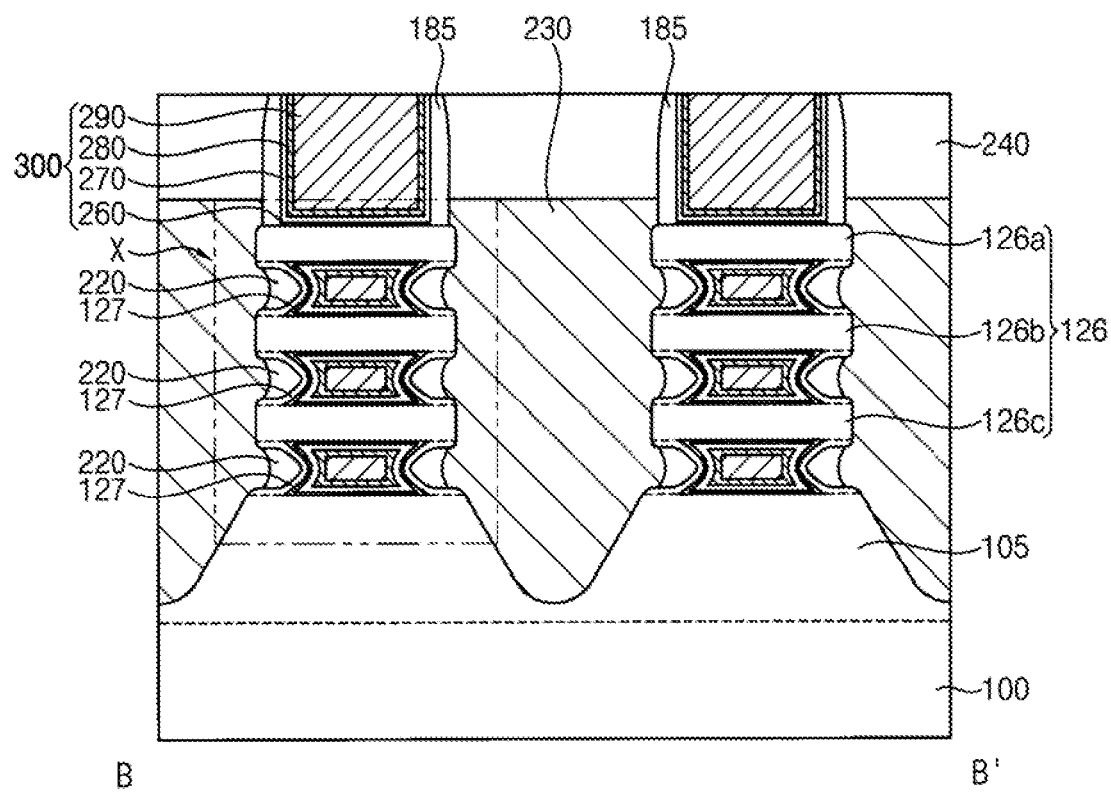
Figure 3:
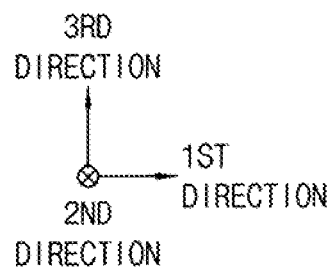
Figure 4:
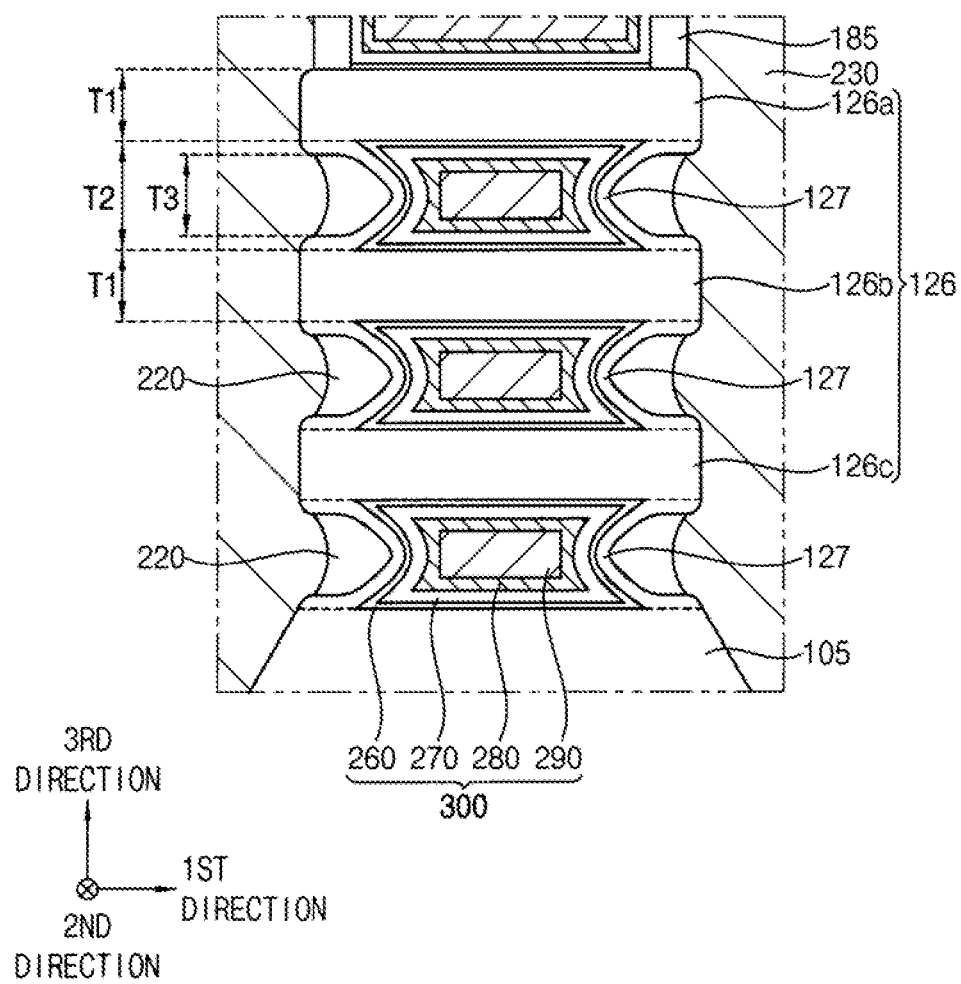

FIGS. 1 to 4 are a plan view and cross-sectional views illustrating a semiconductor device in accordance with example embodiments. FIG. 1 is the plan view, and FIG. 2 is a cross-sectional view taken along a line A-A' in FIG. 1. FIG. 3 is a cross-sectional view taken along a line B-B' in FIG. 1, and FIG. 4 is an enlarged cross-sectional view of an area X of FIG. 3.

Referring to FIGS. 1 to 4, the semiconductor device may include an active pattern 105, a gate structure 300, a semiconductor pattern 126, a channel connection portion 127, and a source/drain layer 230 on a substrate 100. The semiconductor device may further include a gate spacer 185, an inner spacer 220, an isolation pattern 130, and an insulation layer 240.

The substrate 100 may include a semiconductor material such as silicon, germanium, or silicon-germanium, or a group III-V compound such as gallium arsenide (GaAs), aluminum gallium arsenide (AlGaAs), indium arsenide (InAs), indium gallium arsenide (InGaAs), or the like.

The active pattern 105 may protrude from the substrate 100 in the third direction, and may extend (e.g., lengthwise) in the first direction. In an implementation, as illustrated in the drawings, the device may include two active patterns 105. In an implementation, more than two active patterns 105 may be spaced apart from each other in the second direction. The active pattern 105 may be formed by partially removing an upper portion of the substrate 100, and may include a material substantially the same as that of the substrate 100.

A sidewall of the active pattern 105 facing in the second direction may be covered by the isolation pattern 130. The isolation pattern 130 may include, e.g., an oxide such as silicon oxide.

In an implementation, a plurality of semiconductor patterns 126 may be formed at a plurality of levels, respectively, to be spaced apart from each other in the third direction from an upper surface of the active pattern 105. In an implementation, as illustrated in the drawings, the semiconductor patterns 126 may be at three levels, respectively.

In an implementation, as illustrated in the drawings, only two semiconductor patterns 126 spaced apart from each other in the first direction may be at each level on the active pattern 105 and extending lengthwise in the first direction. In an implementation, more than two semiconductor patterns 126 may be formed to be spaced apart from each other in the first direction at each level on the active pattern 105.

In an implementation, the semiconductor patterns 126 may include a first semiconductor pattern 126a at an uppermost level (e.g., distal to the substrate 100 in the third direction), a third semiconductor pattern 126c at a lowermost level (e.g., proximate to the substrate 100 in the third direction), and a second semiconductor pattern 126b therebetween.

In an implementation, the semiconductor pattern 126 may be nanosheets or nanowires including a semiconductor material such as silicon, germanium, or the like. In an implementation, the semiconductor pattern 126 may serve as a channel of a transistor, which may be referred to as the channel.

The channel connection portion 127 may be between the first to third semiconductor patterns 126a, 126b, and 126c and between the active pattern 105 and the third semiconductor pattern 126c so that the first to third semiconductor patterns 126a, 126b, and 126c and the active pattern 105 may be connected with each other in the third direction.

The channel connection portion 127 may include substantially the same material as the first to third semiconductor patterns 126a, 126b, and 126c, e.g., single crystal silicon.

In an implementation, a cross-section in the first direction of the channel connection portion 127 may have a shape of a C or a reversed C. In an implementation, a cross-section in the first direction of the channel connection portion 127 may have a shape of a ring in which a portion is cut in the first direction.

The gate structure 300 may be formed on the substrate 100, and may surround a central portion of the semiconductor pattern 126 in the first direction. In an implementation, as illustrated in the drawings, the gate structure 300 may be formed on two active patterns 105 to cover the respective semiconductor patterns 126 thereon. In an implementation, the gate structure 300 may extend (e.g., lengthwise) in the second direction on the substrate 100 on which the isolation pattern 130 is formed, and may be formed on more than two active patterns 105 spaced apart from each other in the second direction to cover the respective semiconductor patterns 126 thereon, or may be formed only on one active pattern 105 to cover the semiconductor patterns 126 thereon.

In an implementation, as illustrated in the drawings, the substrate 100 may have two gate structures 300 thereon. In an implementation, more than two gate structures 300 may be formed to be spaced apart from each other in the first direction on the substrate 100.

The gate structure 300 may include an interface pattern 260, a gate insulating pattern 270, a work function control pattern 280, and a gate electrode 290 sequentially stacked from a surface of the semiconductor pattern 126, an inner wall of the channel connection portion 127, and/or the upper surface of the active pattern 105.

The interface pattern 260 may be on the upper surface of the active pattern 105, upper and lower surfaces of the semiconductor pattern 126, and the inner wall of the channel connection portion 127. The gate insulating pattern 270 may be formed on the interface pattern 260. The work function control pattern 280 may be formed on the gate insulating pattern 270. The gate electrode 290 may fill a space between the active pattern 105 and the third semiconductor pattern 126c, a space between the second and third semiconductor patterns 126b and 126c, and a space between the first and second semiconductor patterns 126a and 126b.

In an implementation, the interface pattern 260 may cover an entire surface of the gate insulating pattern 270, and upper and lower surfaces of the semiconductor pattern 126 and the inner wall of the channel connection portion 127 may be spaced apart from the gate insulating pattern 270 so as to not contact the gate insulating pattern 270.

The interface pattern 260 may include, e.g., an oxide such as silicon oxide. The gate insulating pattern 270 may include, e.g., a metal oxide having a high permittivity such as hafnium oxide, tantalum oxide, zirconium oxide, or the like. The work function control pattern 280 may include, e.g., titanium nitride, tantalum nitride, tungsten nitride, aluminum oxide, or the like. The gate electrode 290 may include, e.g., a metal such as titanium and aluminum, a metal alloy, or a nitride or carbide of the metal.

The gate structure 300 may be electrically insulated from the source/drain layer 230 by the gate spacer 185, the inner spacer 220, and the channel connection portion 127.

In an implementation, the channel connection portion 127 may have a convex shape that is closed toward a center of the gate structure 300 along the first direction.

The gate spacer 185 may cover opposite sidewalls of the gate structure 300 in the first direction, and may include, e.g., a nitride such as silicon oxynitride, silicon oxynitride, or the like.

The inner spacer 220 may be formed on a sidewall of the channel connection portion 127 between the semiconductor patterns 126 spaced apart from each other in the third direction, and may cover each of opposite sidewalls in the first direction of a lower portion of the gate structure 300. The inner spacer 220 may be spaced apart from the gate structure 300 along the first direction by the channel connection portion 127, and the inner spacer 220 and the gate structure 300 may not contact each other.

In an implementation, a cross-section in the first direction of the inner spacer 220 may have a shape of a horseshoe, a crescent shape, or a shape of a semi-circle with a recess on a sidewall thereof. In an implementation, the cross-section in the first direction of the inner spacer 220 may have a shape of a rectangle with a recess on a sidewall and rounded corners of another sidewall.

The inner spacer 220 may include, e.g., a nitride such as silicon nitride, silicon carbonitride, silicon boronitride, or silicon oxynitride.

In an implementation, the semiconductor pattern 126 (e.g., each of the first to third semiconductor patterns 126a, 126b, and 126c) may have a first thickness T1 in the third direction, a portion of the gate structure 300 between the active pattern 105 and the semiconductor pattern 126 or between the semiconductor patterns 126 may have a second thickness T2 in the third direction, and the inner spacer 220 may have a third thickness T3 in the third direction. The third thickness T3 may be smaller than the second thickness T2. In an implementation, as illustrated in the drawings, the first thickness T1 may be smaller than the second and third thicknesses T2 and T3. In an implementation, the first thickness T1 may be greater than each of the second and third thicknesses T2 and T3, or may be smaller than the second thickness T2 but greater than the third thickness T3. The first thickness T1 may be equal to the second thickness T2 or the third thickness T3.

In an implementation, sidewalls of the first to third semiconductor patterns 126a, 126b, and 126c in the first direction, sidewalls of the channel connection portions 127 connected to upper and/or lower portions of the first to third semiconductor patterns 126a, 126b, and 126c in the first direction, and outer sidewalls of the inner spacers 220 between the first to third semiconductor patterns 126a, 126b, and 126c in the first direction altogether may form an uneven surface.

The source/drain layer 230 may extend (e.g., upwardly) in the third direction on the active pattern 105, and may commonly contact the sidewalls of the semiconductor patterns 126 at a plurality of levels, respectively, in the first direction to be connected thereto.

In an implementation, the source/drain layer 230 may contact the semiconductor patterns 126 and the inner spacers 220 therebetween. A sidewall of the source/drain layer 230 may have an uneven surface, corresponding to the uneven surface of the sidewalls of the first to third semiconductor patterns 126a, 126b, and 126c, the channel connection portion 127, and the inner spacers 220.

In an implementation, a portion of the sidewall of the source/drain layer 230 contacting each of the first to third semiconductor patterns 126a, 126b, and 126c may have a concave shape in the first direction, and a portion of the sidewall thereof contacting each of the inner spacers 220 may have a convex shape in the first direction.

In an implementation, the source/drain layer 230 may include single crystalline silicon carbide doped with n-type impurities or single crystalline silicon doped with n-type impurities, and thus may serve as a source/drain of an NMOS transistor. In an implementation, the source/drain layer 230 may include single crystalline silicon-germanium doped with p-type impurities, and thus may serve as a source/drain of a PMOS transistor.

In an implementation, the source/drain layer 230 may include the n-type or p-type impurities, and the gate structure 300, the source/drain layer 230, and each of the semiconductor patterns 126 serving as a channel may form the NMOS transistor or the PMOS transistor. The semiconductor patterns 126 may be formed at a plurality of levels, respectively, along the third direction, and thus the semiconductor device may be an MBCFET.

The insulation layer 240 may surround a sidewall of the gate spacer 185 and may cover the source/drain layer 230. The insulation layer 240 may include, e.g., an oxide such as silicon oxide.

The semiconductor device may further include a contact plug, a wiring, or the like, which may be electrically connected to the source/drain layer 230 and/or the gate structure 300.

As described above, the inner spacer 220 may have the third thickness T3 smaller than the second thickness T2, which is the thickness of the portion of the gate structure 300 between the semiconductor patterns 126 or between the active pattern 105 and the lowermost semiconductor pattern 126.

A space between the semiconductor patterns 126 may be partially filled with the channel connection portion 127 before forming a second spacer layer 210 illustrated with reference to FIG. 19 subsequently, and thus the second spacer layer 210 may entirely fill the space even if the second spacer layer 210 is formed with a relatively small amount. The second spacer layer 210 may be formed with the relatively small amount, and thus may be easily removed so that no residue remains on the upper surface of the active pattern 105 when the second spacer layer 210 is removed, and the source/drain layer 230 may be effectively formed on the upper surface of the active pattern 105. Accordingly, electrical characteristics of the semiconductor device may be improved.

FIGS. 5 to 24 are plan views and cross-sectional views of stages in a method of manufacturing a semiconductor device in accordance with example embodiments. Specifically, FIGS. 5, 7, 9, 12 and 22 are the plan views, and FIGS. 6, 8, 10-11, 13-21 and 23-24 are the cross-sectional views.

Figure 6:
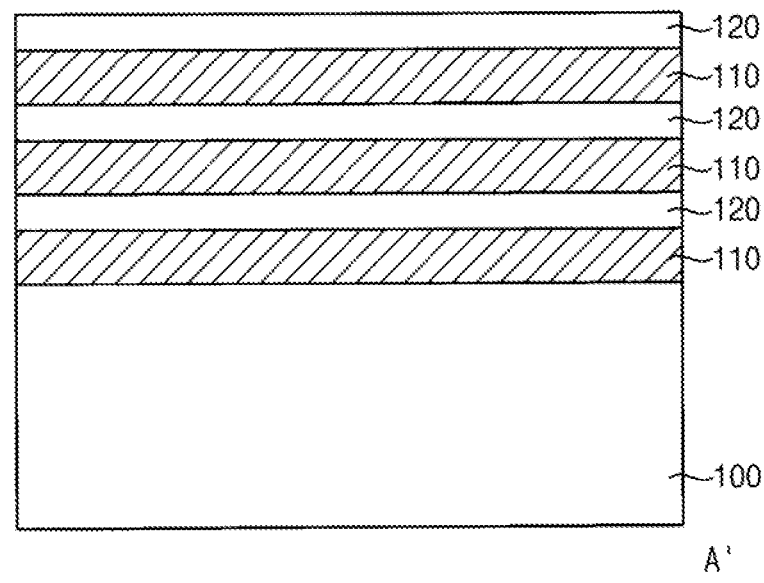
Figure 6:
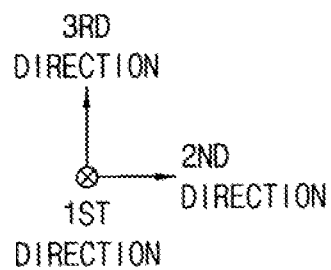
Figure 8:
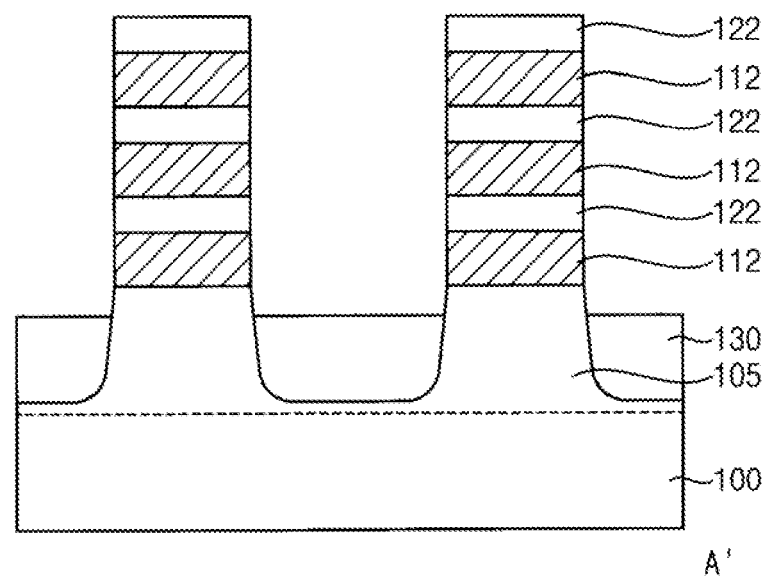
Figure 8:
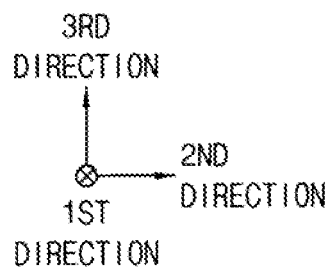
Figure 10:
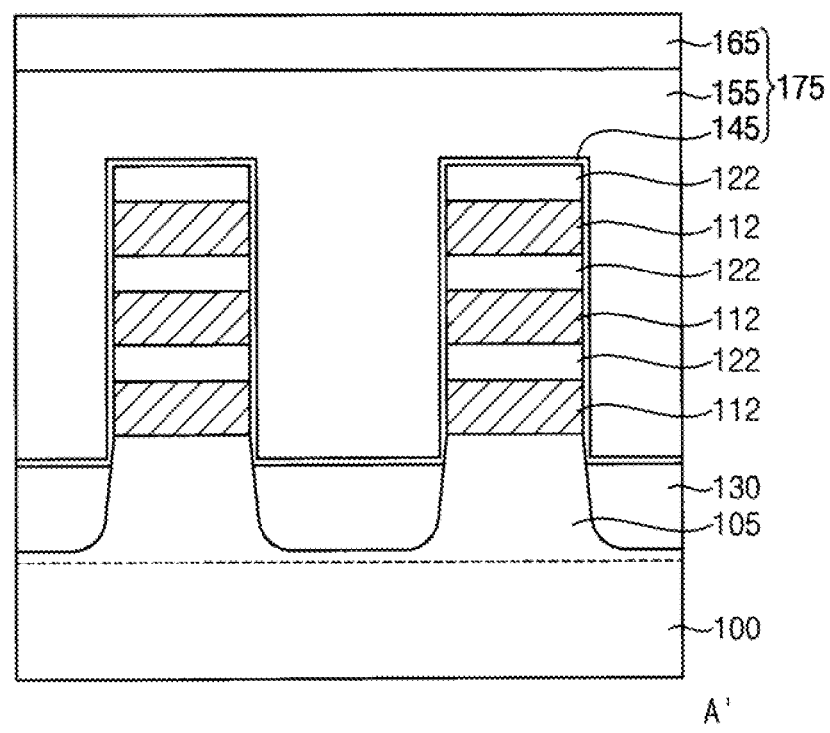
Figure 10:
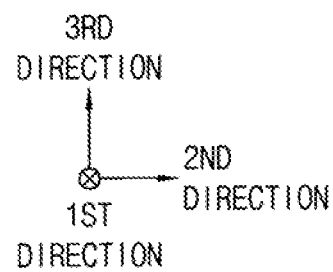

FIGS. 6, 8 and 10 are cross-sectional views taken along lines A-A' of corresponding plan views, respectively, FIGS. 11, 13, 15, 17, 19-20 and 23 are cross-sectional views taken along lines B-B' of corresponding plan views, respectively, and FIGS. 14, 16, 18, and 21 are enlarged cross-sectional views of regions X of corresponding cross-sectional views, respectively.

Figure 5:
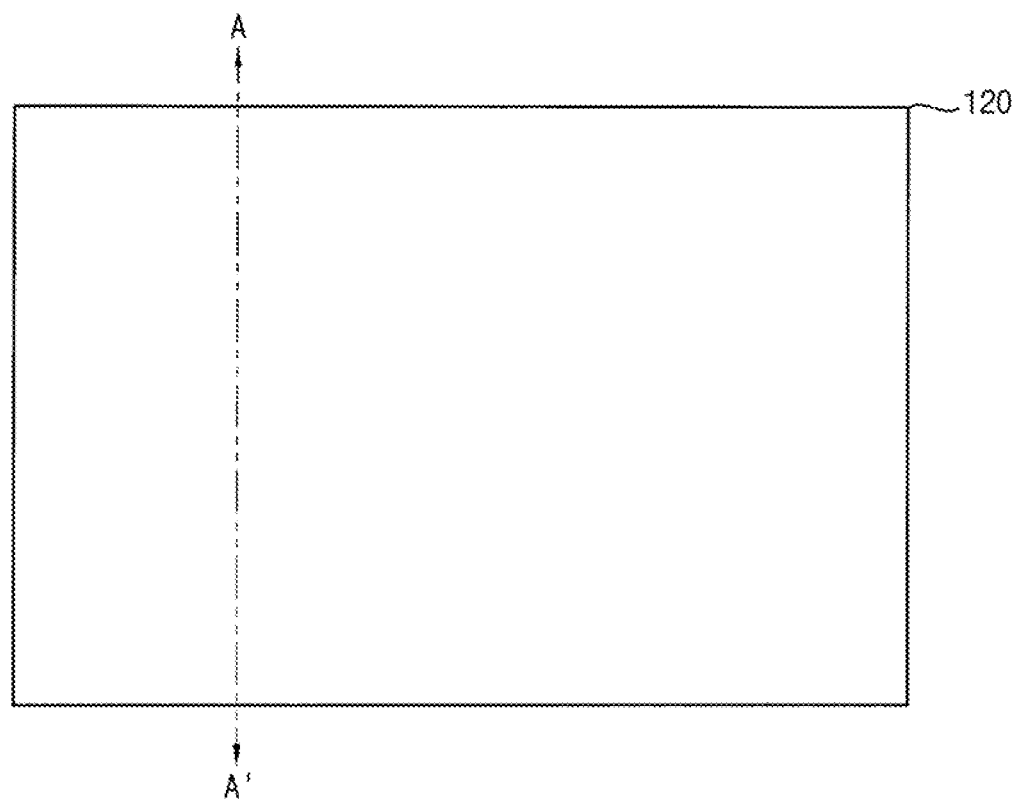
FIGS. 5 to 24 are plan views and cross-sectional views of stages in a method of manufacturing a semiconductor device in accordance with example embodiments.
Figure 5:
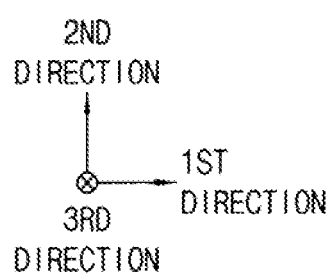

Referring to FIGS. 5 and 6, a sacrificial layer 110 and a semiconductor layer 120 may be alternately and repeatedly stacked on a substrate 100.

In an implementation, as illustrated in FIG. 6, the sacrificial layers 110 and the semiconductor layers 120 may be formed at three levels, respectively, on the substrate 100.

In an implementation, the sacrificial layer 110 may include a material having an etch selectivity with respect to the substrate 100 and the semiconductor layer 120, e.g., silicon-germanium.

In an implementation, the sacrificial layer 110 may be formed by performing an epitaxial growth process using, e.g., a silicon source gas such as dichlorosilane (SiH$_2$Cl$_2$) gas and a germanium source gas such as germane (GeH$_4$) gas, and thus a single crystalline silicon-germanium (SiGe) layer may be formed. In an implementation, the semiconductor layer 120 may be formed by performing an epitaxial growth process using, e.g., a silicon source gas such as disilane (Si$_2$H$_6$) gas, and thus a single crystalline silicon layer may be formed.

Figure 7:
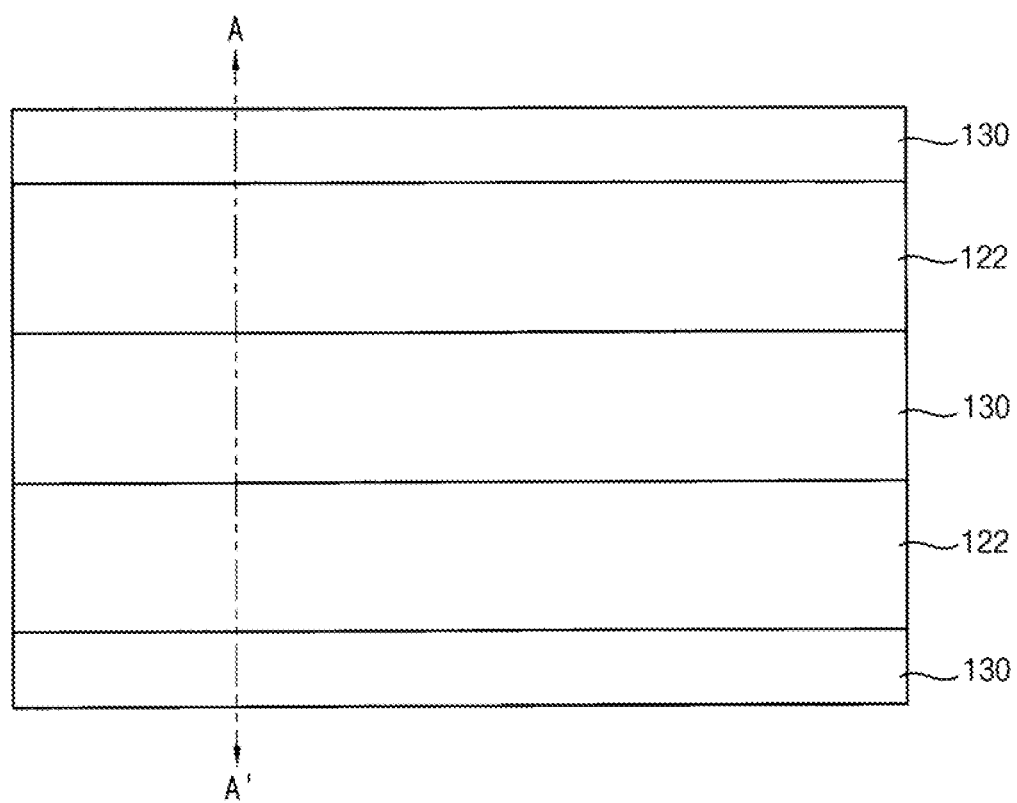
Figure 7:
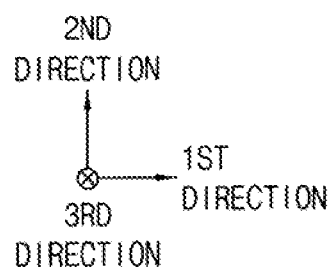

Referring to FIGS. 7 and 8, an etch mask extending in the first direction may be formed on an uppermost one of the semiconductor layers 120 (e.g., distal to the substrate 100 in the third direction), and the semiconductor layer 120, the sacrificial layer 110, and an upper portion of the substrate 100 may be etched using the etch mask.

Accordingly, an active pattern 105 extending in a first direction may be formed on the substrate 100, and a fin structure including sacrificial lines 112 and semiconductor lines 122 alternately and repeatedly stacked on the active pattern 105 may be formed. In an implementation, a plurality of fin structures may be formed on the substrate 100 to be spaced apart from each other in the second direction.

An isolation pattern 130 covering a sidewall of the active pattern 105 may be formed on the substrate 100.

Figure 9:
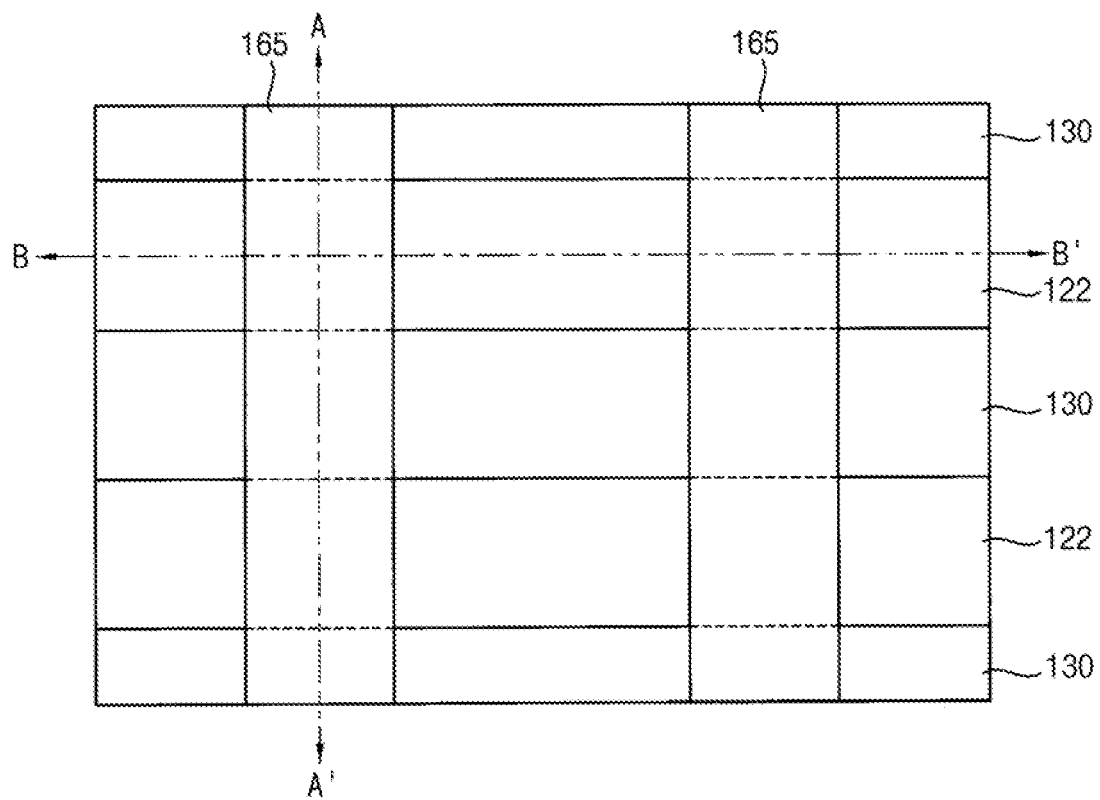
Figure 9:
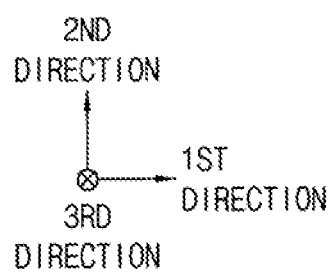
Figure 11:
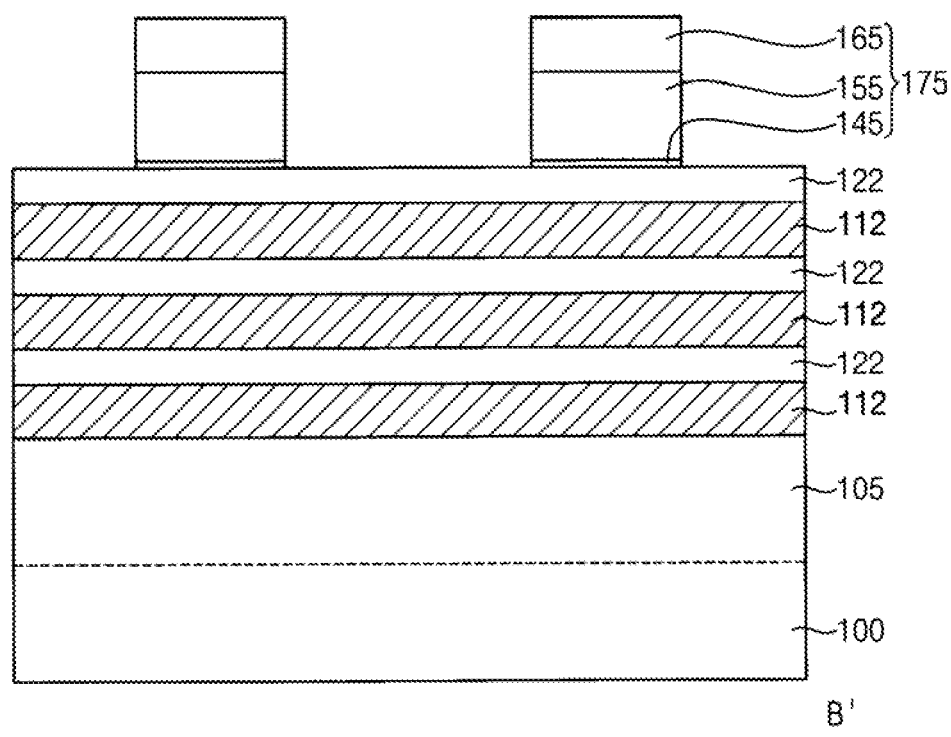
Figure 11:
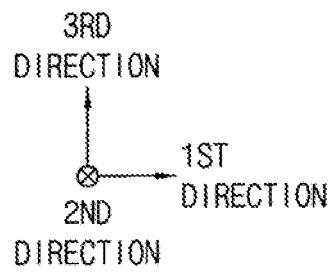

Referring to FIGS. 9 to 11, a dummy gate structure 175 may be formed on the substrate 100 to partially cover the fin structure and the isolation pattern 130.

In an implementation, a dummy gate insulating layer, a dummy gate electrode layer, and a dummy gate mask layer may be sequentially formed on the substrate 100 on which the fin structure and the isolation pattern 130 are formed. An etch mask extending in the second direction may be formed on the dummy gate mask layer, and the dummy gate mask layer may be etched using the etch mask to form a dummy gate mask 165 on the substrate 100.

The dummy gate insulating layer may include, for example, an oxide such as silicon oxide. The dummy gate electrode layer may include, for example, polysilicon. The dummy gate mask layer may include, for example, a nitride such as silicon nitride.

The dummy gate electrode layer and the dummy gate insulating layer may be etched using the dummy gate mask 165 as an etch mask to form a dummy gate electrode 155 and a dummy gate insulating pattern 145, respectively, on the substrate 100.

The dummy gate structure 175 may include the dummy gate insulating pattern 145, the dummy gate electrode 155, and the dummy gate mask 165 sequentially stacked on the active pattern 105 and a portion of the isolation pattern 130 adjacent thereto. In an implementation, the dummy gate structure 175 may extend in the second direction on the fin structure and the isolation pattern 130, and may cover an upper surface and opposite sidewalls in the second direction of the fin structure.

Figure 12:
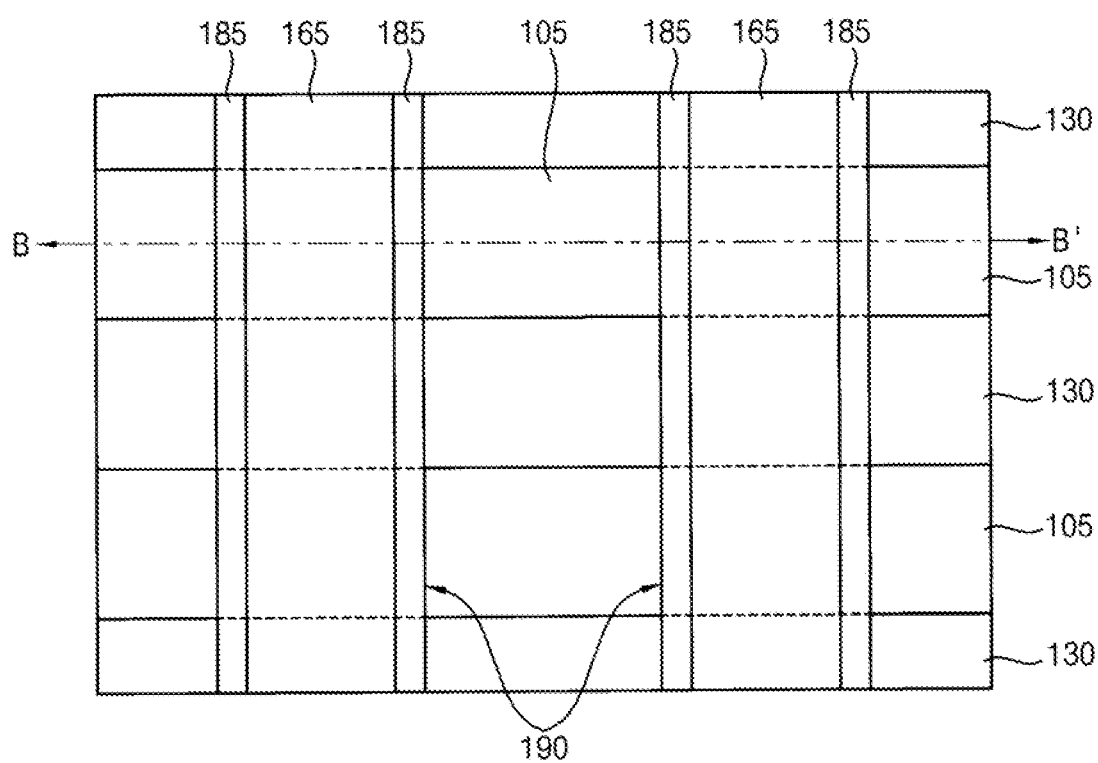
Figure 12:
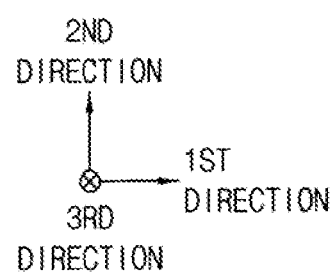
Figure 13:
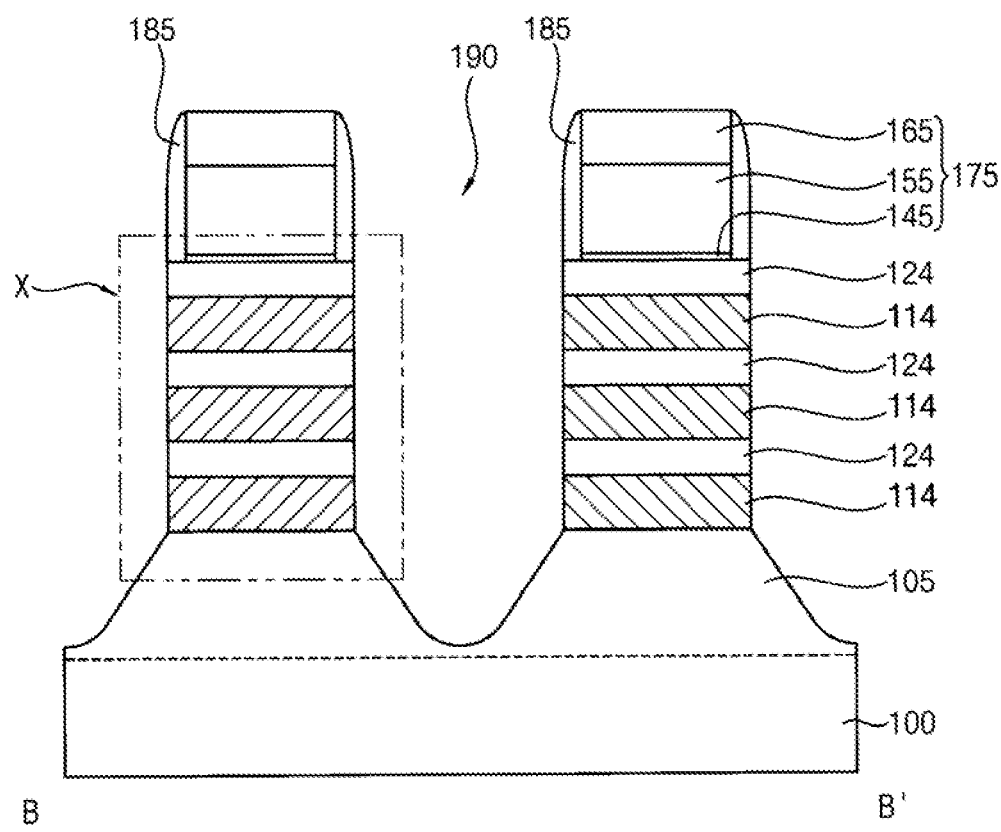
Figure 14:
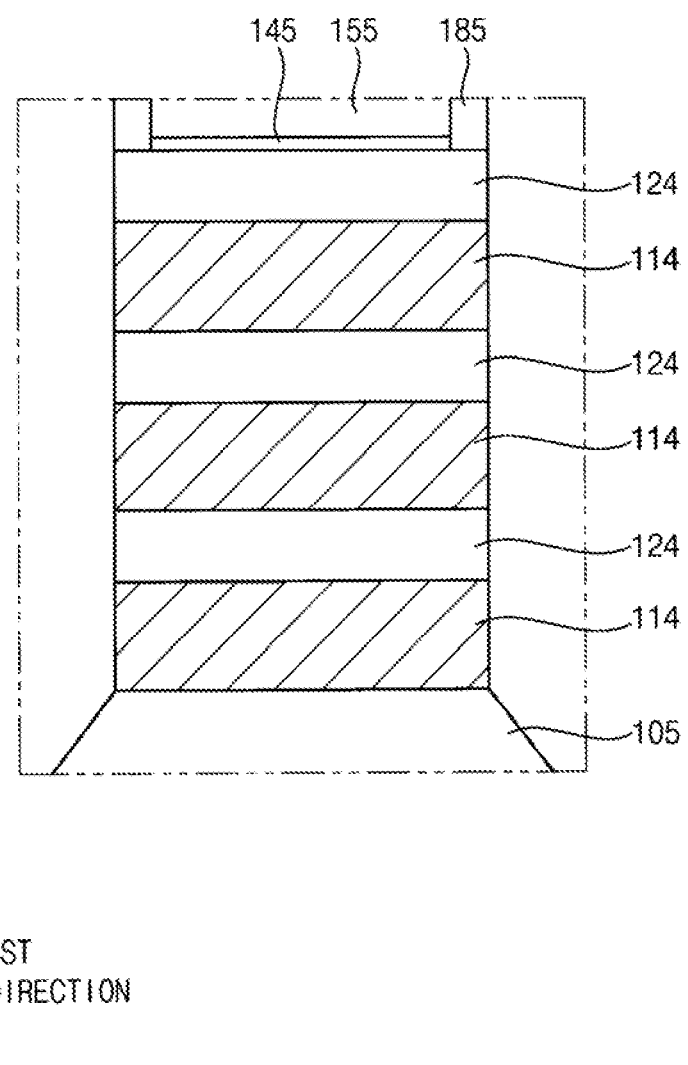

Referring to FIGS. 12 to 14, a gate spacer 185 may be formed on a sidewall of the dummy gate structure 175.

In an implementation, after forming a first spacer layer on the substrate 100 on which the fin structure, the isolation pattern 130, and the dummy gate structure 175 are formed, the first spacer layer maybe anisotropically etched to form a gate spacer 185 covering each of opposite sidewalls of the dummy gate structure 175 in the first direction.

An exposed portion of the fin structure may be etched using the dummy gate structure 175 and the gate spacer 185 as the etch mask to form a first opening 190 exposing the active pattern 105 of the substrate 100 and a portion of the isolation pattern 130 adjacent thereto in the second direction.

In an implementation, the sacrificial lines 112 and the semiconductor lines 122 under the dummy gate structure 175 and the gate spacer 185 may be patterned into sacrificial patterns 114 and preliminary semiconductor patterns 124, respectively, and the fin structures extending in the first direction may be divided into a plurality of pieces spaced apart from each other along the first direction.

Hereinafter, for the convenience of explanation, the dummy gate structure 175, the gate spacer 185 on each of opposite sidewalls thereof, and the fin structure under the dummy gate structure 175 and the gate spacer 185 may be referred to as a first structure. In an implementation, the first structure may extend in the second direction, and a plurality of first structures may be spaced apart from each other along the first direction.

Figure 15:
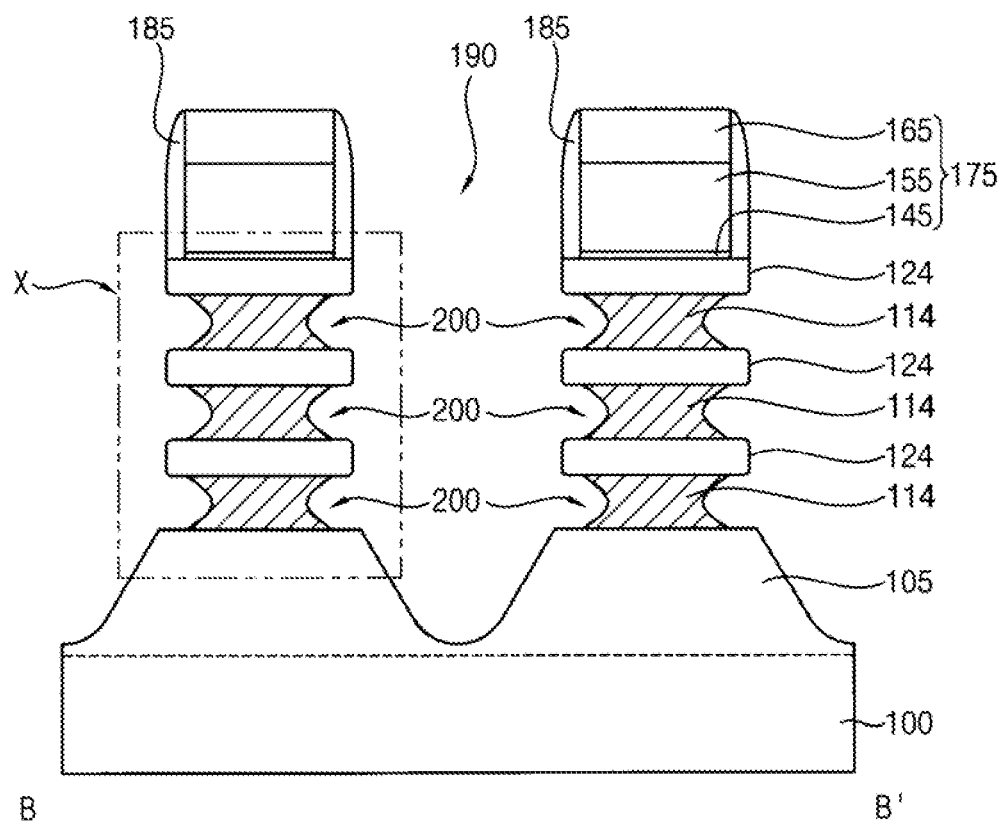
Figure 15:
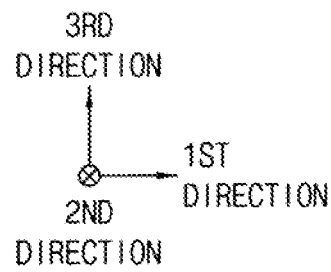
Figure 16:
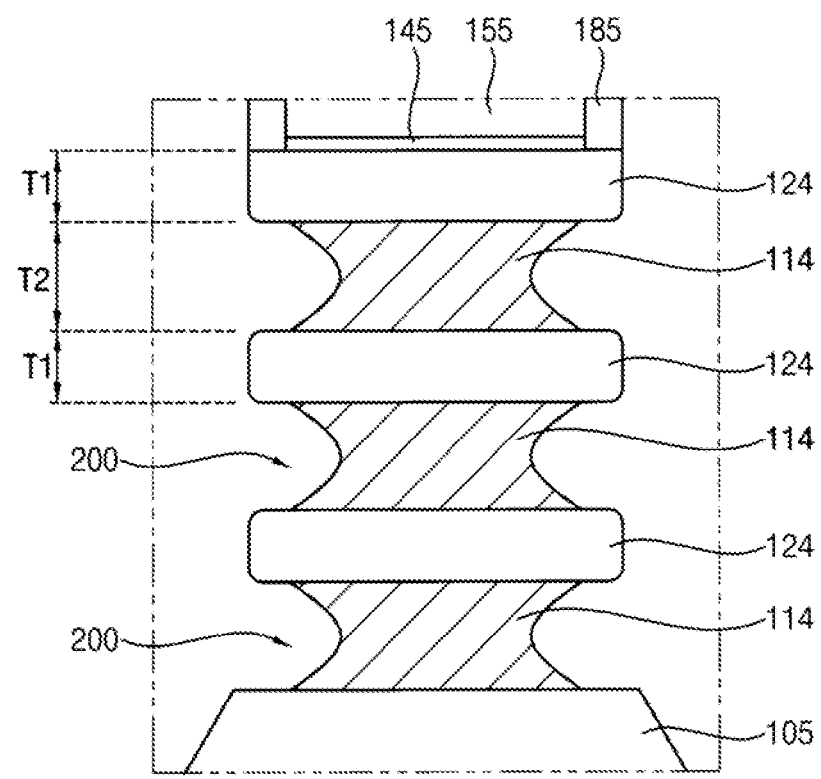
Figure 16:
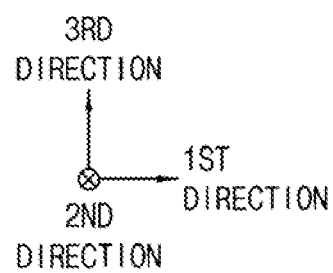

Referring to FIGS. 15 and 16, each of opposite sidewalls in the first direction of the sacrificial pattern 114 exposed by the first opening 190 may be etched to form a first recess 200.

In an implementation, the first recess 200 may be formed by performing a wet etching process on the sacrificial pattern 114. In an implementation, the first recess 200 may have a convex shape protruding inwardly toward a center of the sacrificial pattern 114 along the first direction. In an implementation, the first recess 200 may have a cross-section in the first direction having a shape of a semi-circle.

In an implementation, an end portion (in the first direction) of the preliminary semiconductor pattern 124 adjacent to the first recess 200 may have a shape of a rectangle with rounded corners. A portion of the active pattern 105 under a lowermost one of the sacrificial patterns 114 may have a shape of a trapezoid with rounded corners.

In an implementation, the preliminary semiconductor pattern 124 may have a first thickness T1 (e.g., in the third direction), the sacrificial pattern 114 may have a second thickness T2, and a maximum thickness of the first recess 200 may be substantially equal to the second thickness T2 of the sacrificial pattern 114. In an implementation, the first thickness T1 may be smaller than the second thickness T2.

Figure 17:
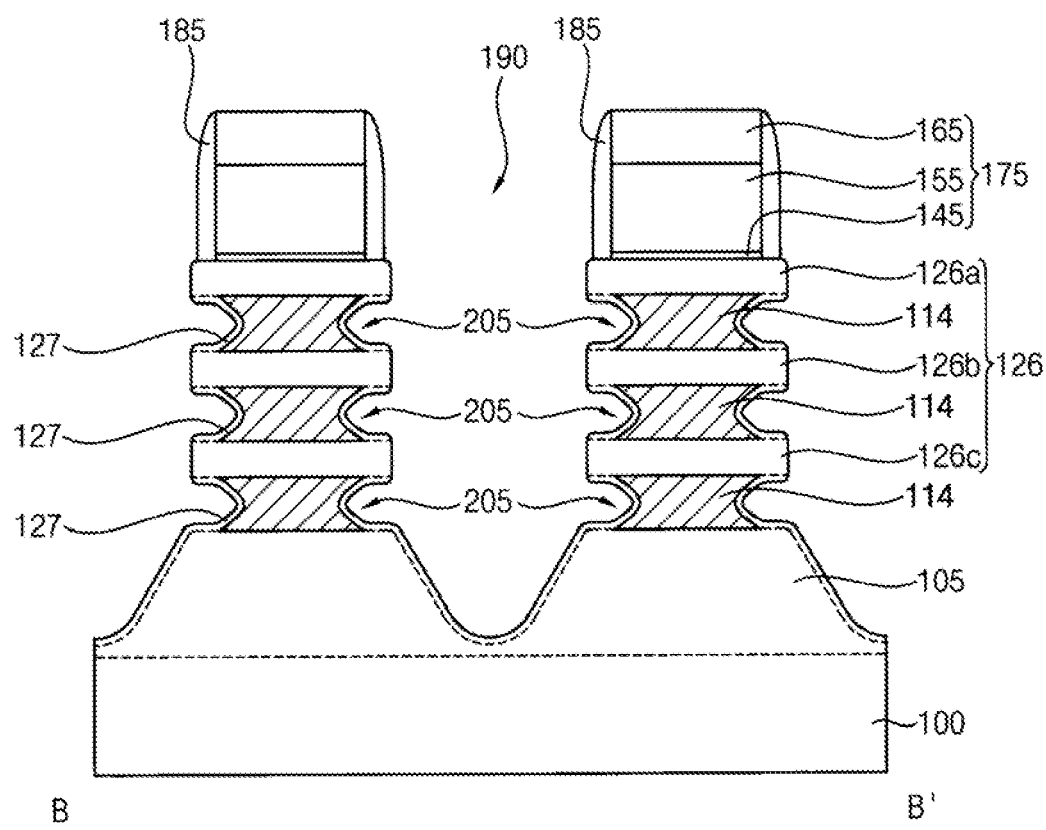
Figure 17:
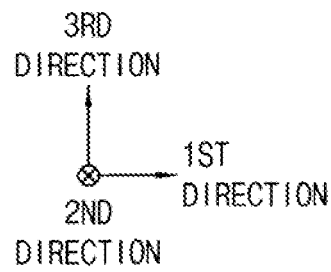
Figure 18:
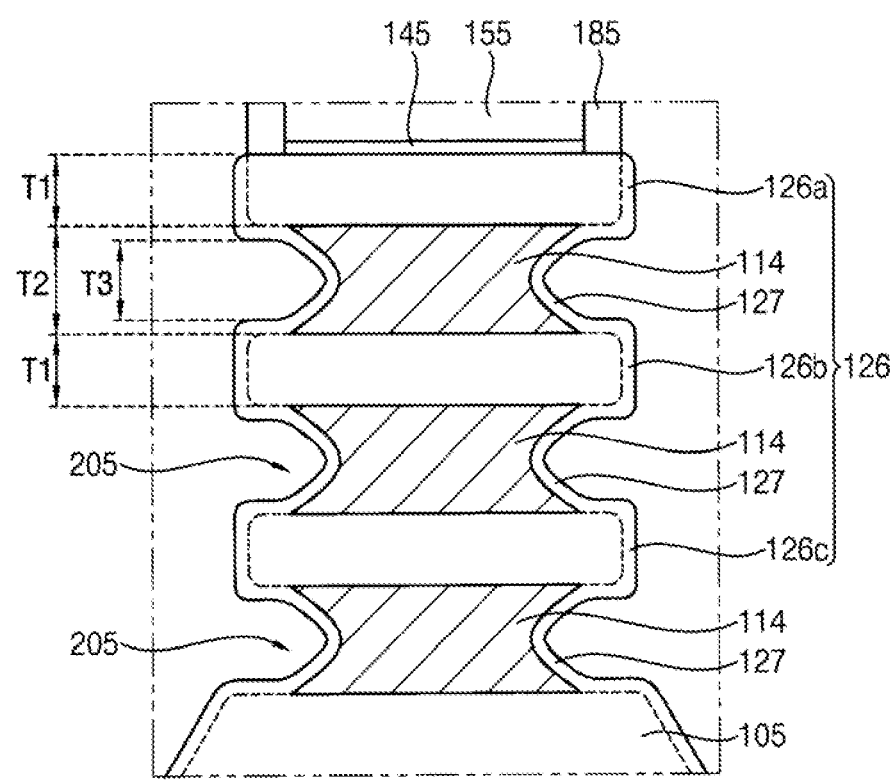
Figure 18:
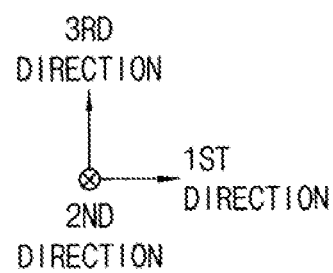

Referring to FIGS. 17 and 18, a first selective epitaxial growth (SEG) process may be performed using surfaces of layers including silicon as a seed, e.g., a surface of the preliminary semiconductor pattern 124, a surface of the sacrificial pattern 114, and an upper surface of the active pattern 105 exposed by the first opening 190 and the first recess 200 as a seed.

In an implementation, a width of the preliminary semiconductor pattern 124 in the first direction may be increased, and a thickness of an edge portion thereof in the third direction may be also increased. The preliminary semiconductor patterns 124 having the increased width may be semiconductor patterns 126, respectively.

In an implementation, the semiconductor patterns 126 may include a first semiconductor pattern 126a at an uppermost level (e.g., distal to the substrate 100 in the third direction), a third semiconductor pattern 126c at a lowermost level (e.g., proximate to the substrate 100 in the third direction), and a second semiconductor pattern 126b therebetween, and the first to third semiconductor patterns 126a, 126b, and 126c may protrude in the first direction from (e.g., outwardly beyond) the gate spacer 185 in a plan view.

The sacrificial patterns 114 may include silicon-germanium, and thus silicon included in the sacrificial patterns 114 may be also used as the seed in the first SEG process. In an implementation, a channel connection portion 127 may be formed to cover each of opposite sidewalls of each of the sacrificial patterns 114.

Hereinafter, a portion of the semiconductor pattern 126 increased from the preliminary semiconductor pattern 124 in the first direction by the first SEG process may be considered as a portion of the semiconductor pattern 126. In an implementation, a portion of the semiconductor pattern 126 increased from the preliminary semiconductor pattern 124 in the third direction by the first SEG process may be considered as the channel connection portion 127.

In an implementation, a plurality of channel connection portions 127 may be formed between neighboring ones of the first to third semiconductor patterns 126a, 126b, and 126c along the third direction, and may connect the first to third semiconductor patterns 126a, 126b, and 126c with each other. In an implementation, the channel connection portion 127 may be also formed between the third semiconductor pattern 126c and the active pattern 105, and may connect the third semiconductor pattern 126c with the active pattern 105. The first to third semiconductor patterns 126a, 126b, and 126c and the channel connection portions 127 therebetween may each include single crystalline silicon.

In an implementation, the channel connection portion 127 may have a convex shape protruding inwardly toward the center of each sacrificial pattern 114 along the first direction. In an implementation, a cross-section in the first direction of the channel connection portion 127 may have a shape of a C or a reversed C. In an implementation, a cross-section in the first direction of the channel connection portion 127 may have a shape of a ring in which a portion is cut in the first direction.

As the first SEG process is performed, the channel connection portion 127 may be formed at upper and lower portions of the first recess 200, respectively, and thus a maximum thickness in the third direction of the first recess 200 may be decreased, and the first recess 200 may then be a second recess 205.

In an implementation, the semiconductor pattern 126 may have a thickness after the first SEG process, which is substantially the same as that of the semiconductor pattern 126 before the first SEG process, e.g., the first thickness T1, and the sacrificial pattern 114 may also have a thickness after the first SEG process, which is substantially the same as that of the sacrificial pattern 114 before the first SEG process, e.g., the second thickness T2. In an implementation, the second recess 205 may have a thickness smaller than that of the sacrificial pattern 114, e.g., the third thickness T3. In an implementation, the third thickness T3 of the second recess 205 may be a distance between an upward-facing lowermost surface and a downward-facing uppermost surface of the channel connection portion 127.

The first SEG process may also be performed on an upper surface of the active pattern 105 exposed by the first opening 190, and thus a thickness of the active pattern 105 may be increased.

Figure 19:
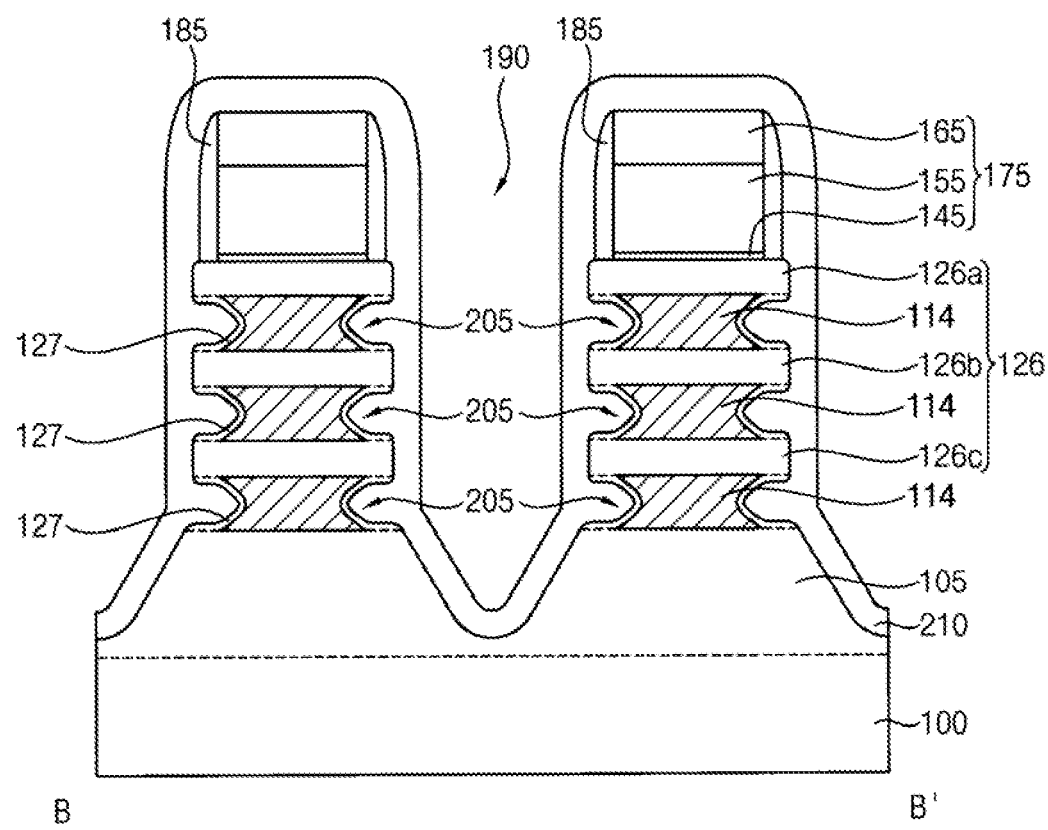
Figure 20:
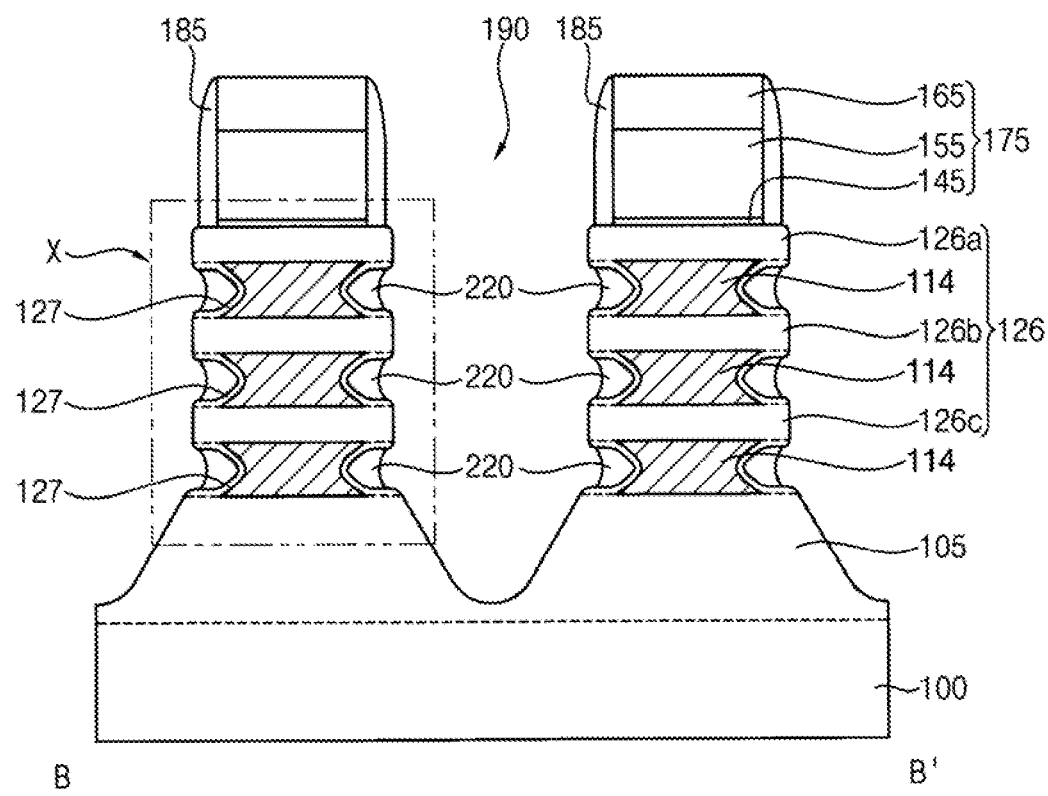
Figure 21:
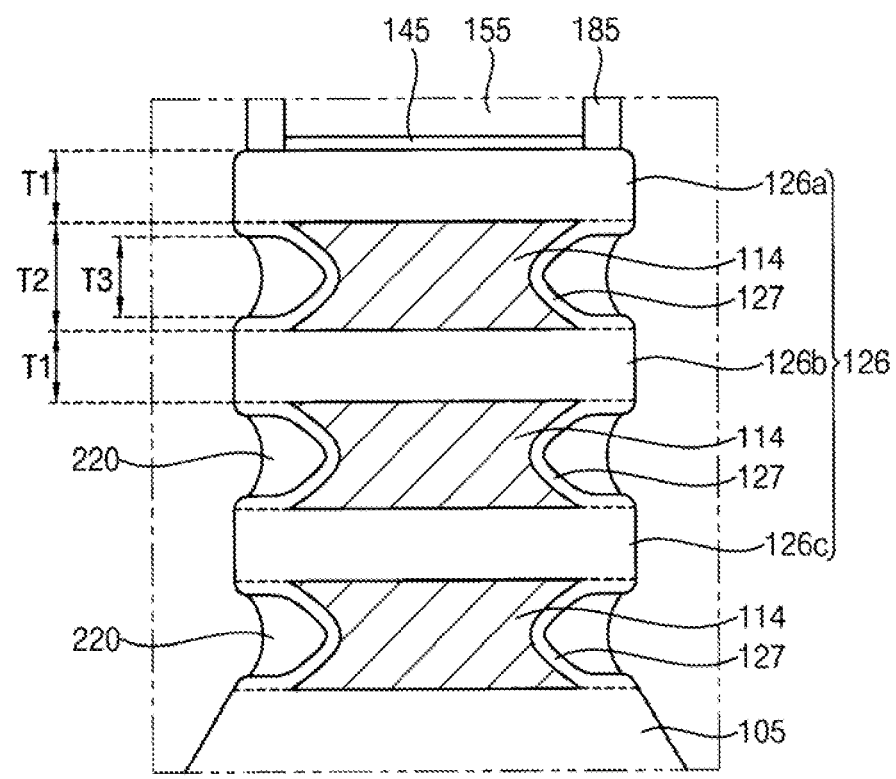
Figure 21:
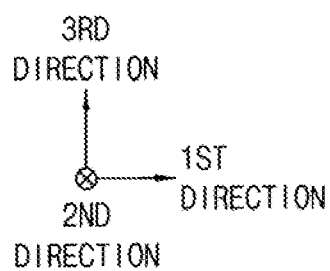

Referring to FIGS. 19 to 21, a second spacer layer 210 may be formed on the dummy gate structure 175, the gate spacer 185, the fin structure, the active pattern 105, and the isolation pattern 130, and the second spacer layer 210 may be anisotropically etched to form an inner spacer 220 at least partially filling the second recess 205.

The inner spacer 220 may be formed on a sidewall of the sacrificial pattern 114 between neighboring ones of the first to third semiconductor patterns 126a, 126b, and 126c in the third direction. In an implementation, the inner spacer 220 may be spaced apart from the sacrificial pattern 114 by the channel connection portion 127 so as not to contact the sacrificial pattern 114 (e.g., due to the presence of the channel connection portion 127).

In an implementation, a plurality of inner spacers 220 may be formed (e.g., spaced apart) along the third direction, and each of the inner spacers 220 may have a maximum thickness substantially equal to that of the second recess 205, e.g., the thickness T3.

In an implementation, an inner sidewall of the inner spacer 220 contacting the sacrificial pattern 114 may have a convex shape protruding inwardly toward the center of the sacrificial pattern 114 along the first direction, and an outer sidewall of the inner spacer 220 exposed by or to the first opening 190 may have a concave shape that is open along or toward the first direction. In an implementation, the inner spacer 220 may have a cross-section in the first direction having a shape of a semi-circle.

In an implementation, sidewalls of the first to third semiconductor patterns 126a, 126b, and 126c in the first direction, sidewalls of the channel connection portions 127 connected to upper and/or lower portions of the first to third semiconductor patterns 126a, 126b, and 126c in the first direction, and the outer sidewalls of the inner spacers 220 between the first to third semiconductor patterns 126a, 126b, and 126c in the first direction altogether may form an uneven surface. The sidewalls of the first to third semiconductor patterns 126a, 126b, and 126c may protrude in the first direction, and the outer sidewalls of the inner spacers 220 may be recessed in the first direction.

In an implementation, the outer sidewall of the inner spacer 220 may protrude in the first direction from or beyond the sidewall of the gate spacer 185 in a plan view. In an implementation, the sidewall of the gate spacer 185 may protrude in the first direction from or beyond the outer sidewall of the inner spacer 220 in a plan view.

Figure 22:
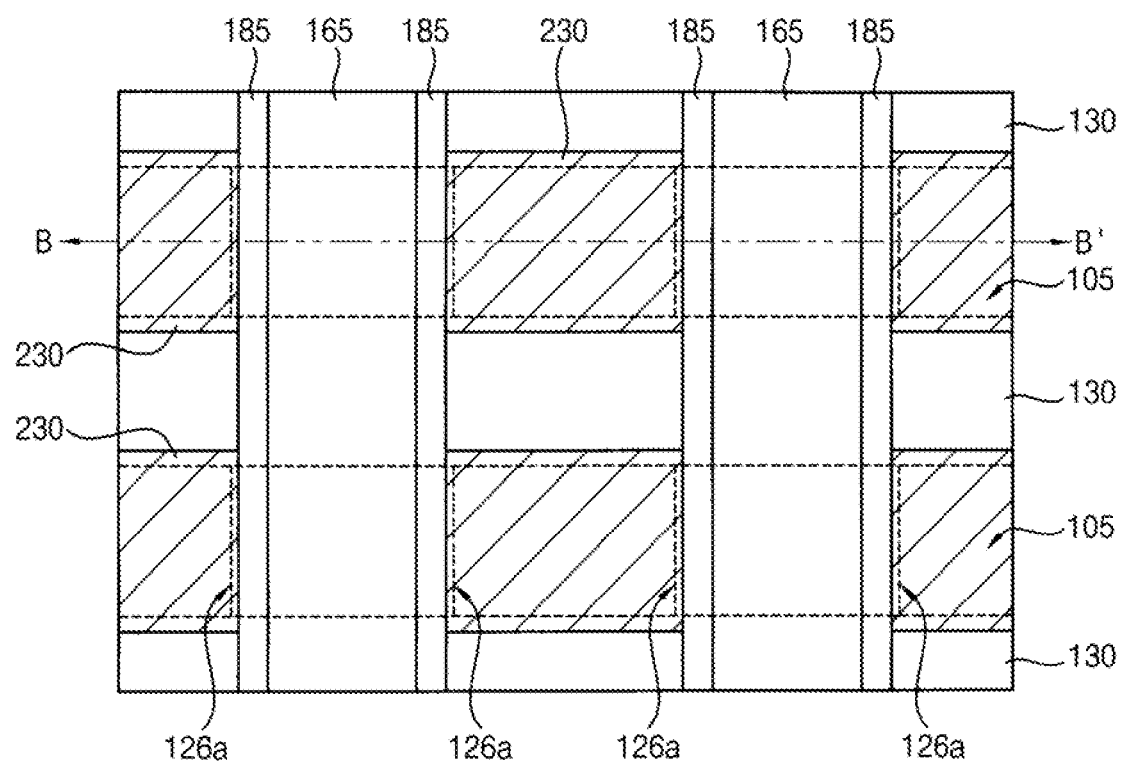
Figure 23:
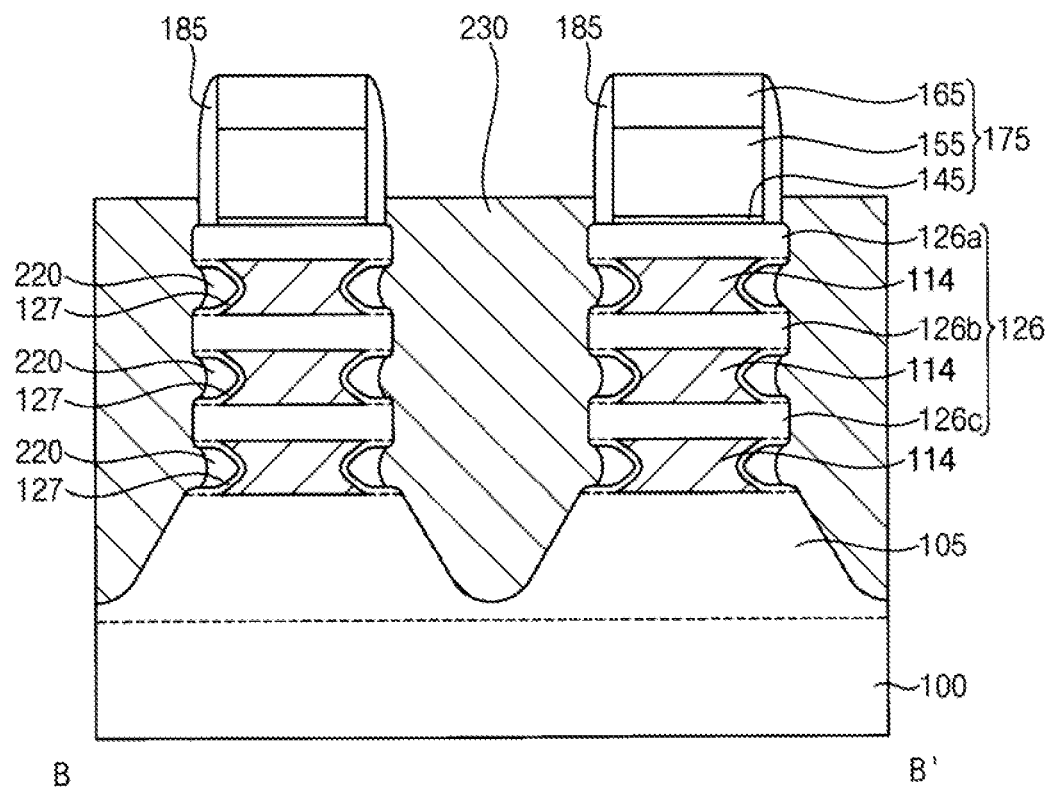

Referring to FIGS. 22 and 23, a second selective epitaxial growth (SEG) process may be performed using the sidewalls of the semiconductor patterns 126 and the upper surface of the active pattern 105 exposed by the first opening 190 as a seed, so that a source/drain layer 230 may be formed on the sidewalls of the semiconductor patterns 126. The source/drain layer 230 may fill the first opening 190 on the active pattern 105, and further grow in the third direction to contact a lower sidewall of the gate spacer 185.

During the second SEG process, the channel connection portion 127 and the inner spacer 220 are sequentially stacked on the sidewall of the sacrificial pattern 114, and thus the sacrificial pattern 114 may not be used as a seed. In an implementation, portions of the channel connection portion 127 directly on and beneath the semiconductor pattern 126 may be exposed by the first opening 190, and thus may be used as a seed for the second SEG process. In an implementation, the sacrificial pattern 114 may not contact the source/drain layer 230 due to the presence of the channel connection portion 127 and the inner spacer 220. In an implementation, the portions of the channel connection portion 127 directly on and beneath the semiconductor pattern 126 may at least partially contact the source/drain layer 230.

In an implementation, the second SEG process may be performed using a silicon source gas, e.g., disilane ($Si_2H_6$) gas, and a carbon source gas, e.g., $SiH_3CH_3$ gas, and thus a single crystalline silicon carbide (SiC) layer may be formed. In an implementation, the second SEG process may be performed using only a silicon source gas, e.g., disilane ($Si_2H_6$) gas, and thus a single crystalline silicon layer may be formed. The source/drain layer 230 may serve as a source/drain of an NMOS transistor.

In an implementation, the second SEG process may be performed using a silicon source gas, e.g., dichlorosilane ($SiH_2Cl_2$) gas, and a germanium source gas, e.g., germane ($GeH_4$) gas, and thus a single crystalline silicon-germanium (SiGe) layer may be formed. The source/drain layer 230 may serve as a source/drain of a PMOS transistor.

In an implementation, the source/drain layer 230 may be formed to contact the semiconductor patterns 126 and the inner spacers 220 therebetween. A sidewall of the source/drain layer 230 may also have an uneven surface, corresponding to the uneven surface of the sidewalls of the first to third semiconductor patterns 126a, 126b, and 126c, the channel connection portion 127, and the inner spacers 220.

In an implementation, a portion of the sidewall of the source/drain layer 230 contacting each of the first to third semiconductor patterns 126a, 126b, and 126c may have a concave shape in the first direction, and a portion of the sidewall of the source/drain layer 230 contacting each of the inner spacers 220 may have a convex shape in the first direction.

Figure 24:
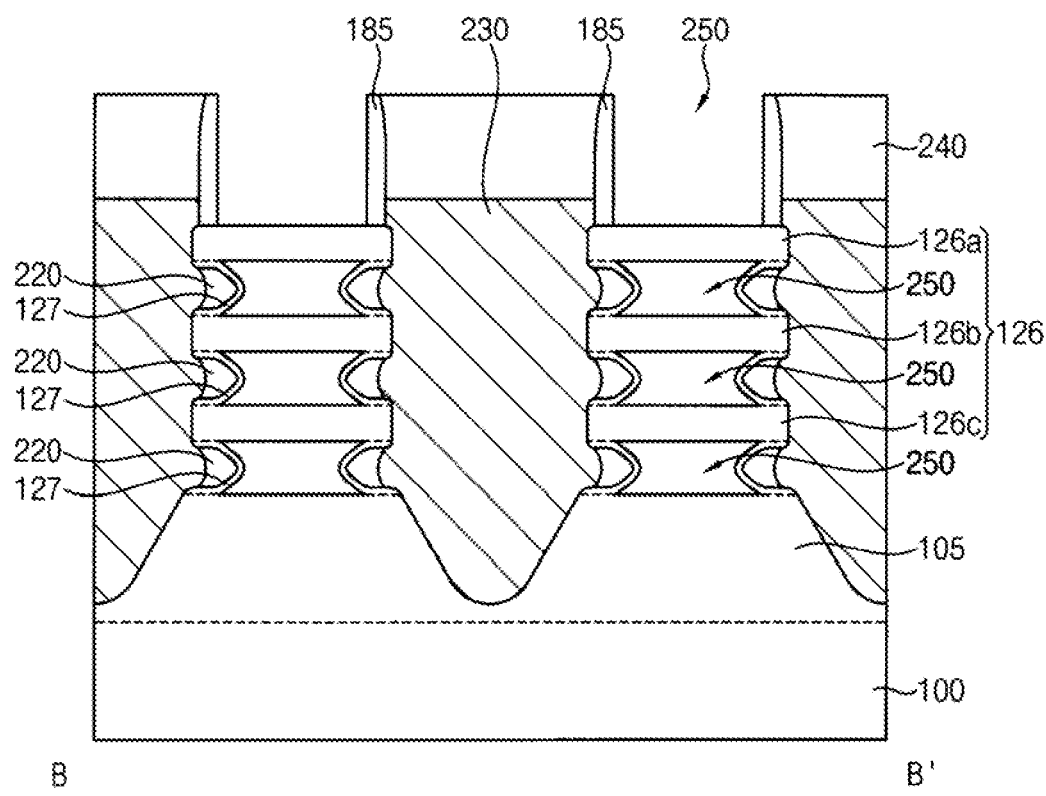

Referring to FIG. 24, after forming the insulation layer 240 on the substrate 100 to cover the first structure and the source/drain layer 230, the insulation layer 240 may be planarized until an upper surface of the dummy gate electrode 155 of the first structure is exposed. The dummy gate mask 165 may be also removed, and an upper portion of the gate spacer 185 may be partially removed.

The planarization process may be performed by a chemical mechanical polishing (CMP) process and/or an etch back process.

The exposed dummy gate electrode 155, the dummy gate insulating pattern 145 thereunder, and the sacrificial patterns 114 may be removed, e.g., by a wet etching process and/or a dry etching process, and a second opening 250 may be formed to expose an inner sidewall of the gate spacer 185, an inner sidewall of the channel connection portion 127, a surface of the semiconductor pattern 126, and the upper surface of the active pattern 105.

Referring to FIGS. 1 to 4 again, a gate structure 300 may be formed on the substrate 100 to fill the second opening 250.

In an implementation, an interface pattern 260 may be formed by performing a thermal oxidation process on the upper surface of the active pattern 105, the inner sidewall of the channel connection portion 127, and the surface of the semiconductor pattern 126 exposed by the second opening 250. A gate insulating layer and a work function control layer may be conformally formed on a surface of the interface pattern 260, and a gate electrode layer may be formed to sufficiently fill a remaining portion of the second opening 250.

The gate insulating layer, the work function control layer, and the gate electrode layer may be formed by a chemical vapor deposition (CVD) process, an atomic layer deposition (ALD) process, or a physical vapor deposition (PVD) process. In an implementation, the interface pattern 260 may be also formed by the CVD process or the ALD process instead of the thermal oxidation process.

The gate electrode layer, the work function control layer, and the gate insulating layer may be planarized until an upper surface of the insulation layer 240 is exposed, so that a gate electrode 290, a work function control pattern 280, and a gate insulating pattern 270 may be respectively formed. The interface pattern 260, the gate insulating pattern 270, the work function control pattern 280, and the gate electrode 290 may form the gate structure 300.

The interface pattern 260 may include, e.g., an oxide such as silicon oxide. The gate insulating pattern 270 may include, e.g., a metal oxide having a high permittivity such as hafnium oxide, tantalum oxide, zirconium oxide, or the like. The work function control pattern 280 may include, e.g., titanium nitride, tantalum nitride, tungsten nitride, aluminum oxide, or the like. The gate electrode 290 may include, e.g., a metal such as titanium and aluminum, a metal alloy, or a nitride or carbide of the metal.

The interface pattern 260 may be formed on upper and lower surfaces of the semiconductor pattern 126 and the inner sidewall of the channel connection portion 127 exposed by the second opening 250 and including single crystalline silicon, and may entirely surround an edge of the second opening 250. The active pattern 105 may also include single crystal silicon, and thus the interface pattern 260 may be also formed on the upper surface of the active pattern 105.

In an implementation, a sidewall of the interface pattern 260 of the gate structure 300 facing the source/drain layer 230 may have a concave shape that is in the first direction toward the source/drain layer 230, and may contact the inner sidewall of the channel connection portion 127 connecting the semiconductor patterns 126.

In an implementation, the gate structure 300 and the inner spacer 220 may be spaced apart from each other by the channel connection portion 127, so as not to be in contact with each other.

In an implementation, the gate structure 300 may have a thickness substantially equal to the thickness of the sacrificial pattern 114, e.g., the gate structure 300 may have the second thickness T2. The inner spacer 220 may have a thickness smaller than the second thickness T2 of the sacrificial pattern 114, e.g., the inner spacer 220 may have the third thickness T3.

As described above, the first SEG process may be performed on the surfaces of the semiconductor patterns 126 exposed by the first opening 190 and the first recess 200 to form the second recess 205 having a thickness smaller than that of the first recess 200. Thus, the second spacer layer 210 for forming the inner spacer 220 may be formed to entirely fill the second recess 205 even if the second spacer layer is formed with a relatively small amount. Additionally, the second spacer layer 210 may be more easily removed after the inner spacer 220 is formed, and a residue may not remain on the upper surface of the active pattern 105. Accordingly, the upper surface of the active pattern 105 may be entirely exposed by the first opening 190, and the source/drain layer 230 may be effectively formed on the upper surface of the exposed active pattern 105, and electrical characteristics of the semiconductor device may be improved.

The sacrificial pattern 114 may include silicon-germanium, and the first SEG process may be performed using surfaces of layers including silicon as a seed, and thus the channel connection portion 127 connecting the active pattern 105 and the first to third semiconductor patterns 126a, 126b, and 126c with each other in the third direction may be formed on the sidewall of the sacrificial pattern 114. The channel connection portion 127 may include single crystalline silicon, and the interface pattern 260 may be also formed on the inner sidewall of the channel connection portion 127 exposed by the second opening 250, and the gate insulating pattern 270, the work function control pattern 280, and the gate electrode 290 sequentially stacked may be spaced apart to be electrically insulated from the source/ drain layer 230 by the interface pattern 260, the channel connection portion 127 and the inner spacer 220.

Figure 25:
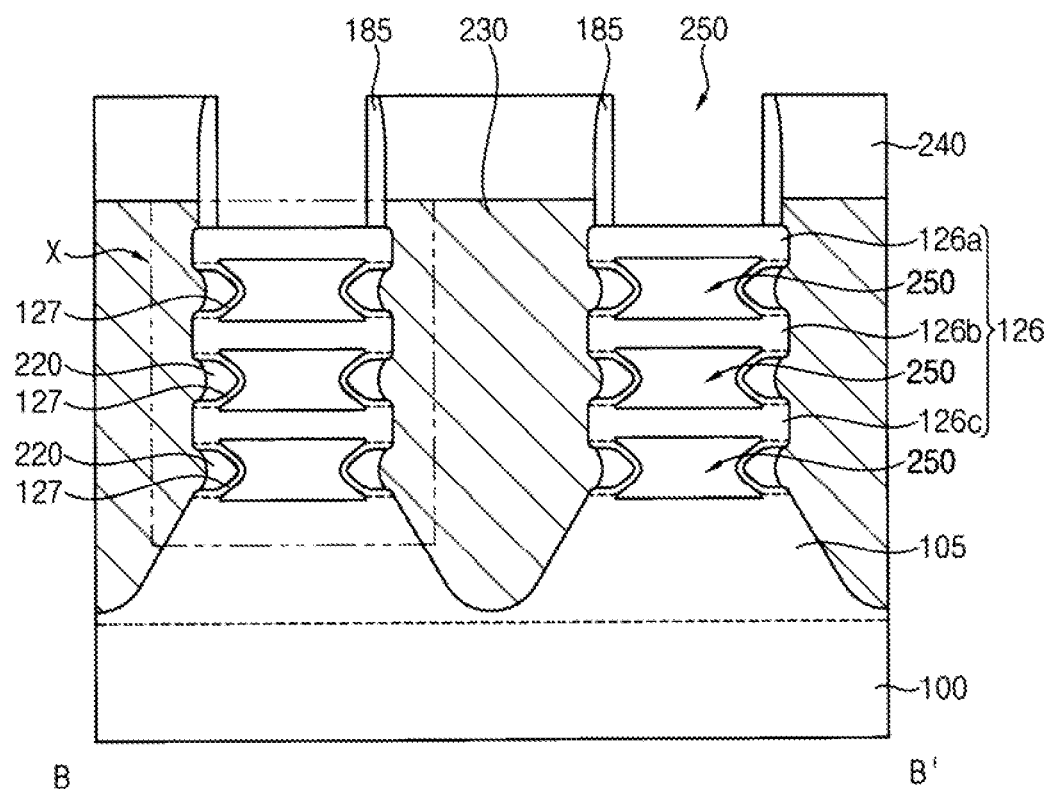
FIGS. 25 to 27 are cross-sectional views of stages in a method of manufacturing a semiconductor device in accordance with example embodiments.
Figure 25:
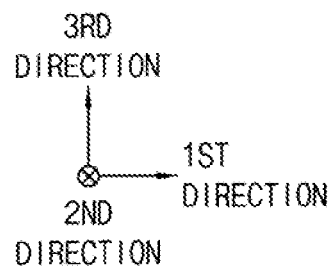
Figure 26:
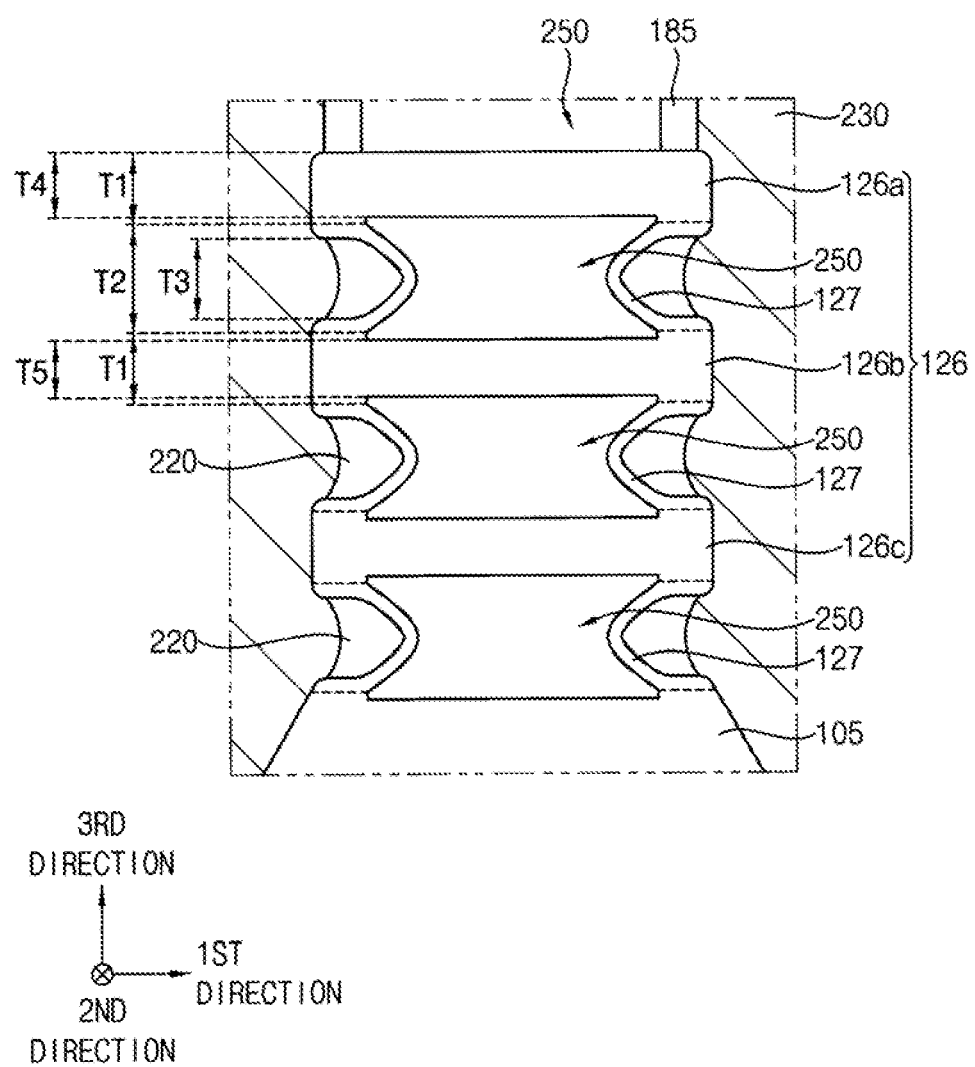
Figure 27:
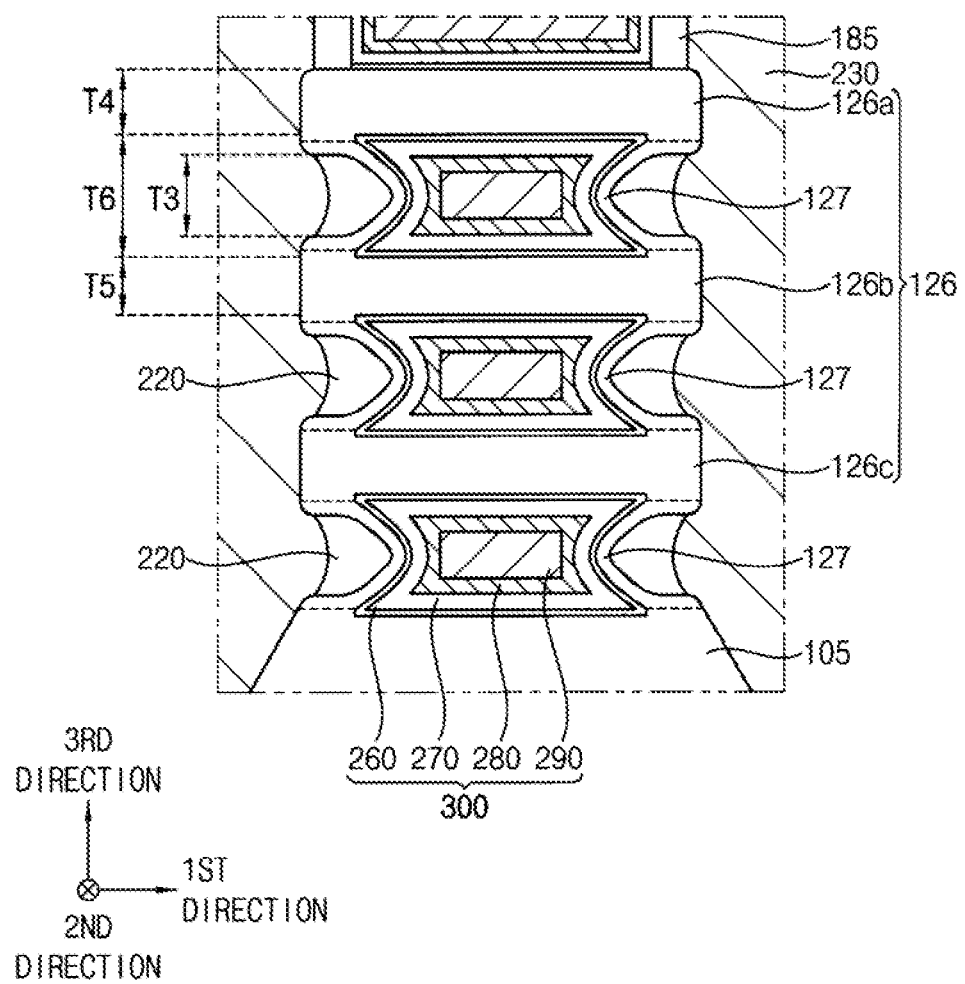

FIGS. 25 to 27 are cross-sectional views of stages in a method of manufacturing a semiconductor device in accordance with example embodiments, and are cross-sectional views taken along lines B-B' of corresponding plan views, respectively. This manufacturing method may include processes substantially the same as or similar to those illustrated with reference to FIGS. 5 to 24 and 1 to 4 except for shapes of some components, and thus like reference numerals refer to like elements, and repeated descriptions thereon may be omitted herein.

Referring to FIGS. 25 and 26, processes substantially the same as or similar to those illustrated with reference to FIGS. 5 to 24 may be performed.

In an implementation, when the sacrificial patterns 114 are removed by, e.g., a wet etching process and/or a dry etching process, surfaces of the semiconductor patterns 126 on and beneath the sacrificial patterns 114 may be also partially removed.

In an implementation, the wet etching process and/or the dry etching process for removing the sacrificial patterns 114 may be performed by using an etching solution and/or etching gas for selectively removing silicon-germanium. In an implementation, the surfaces of the semiconductor patterns 126 including single crystalline silicon and the upper surfaces of the active patterns 105 may be also partially removed along with the sacrificial patterns 114.

In an implementation, a portion of the second opening 250 between the active pattern 105 and the third semiconductor pattern 126c, and a portion of the second opening 250 between the first to third semiconductor patterns 126a, 126b, and 126c may be enlarged in the third direction.

In an implementation, after the wet etching process and/or the dry etching process is performed, a central portion in the first direction of the first semiconductor pattern 126a at an uppermost level among the semiconductor patterns 126 may have a fourth thickness T4 smaller than the first thickness T1, and a central portion in the first direction of each of the second and third semiconductor patterns 126b and 126c thereunder may have a fifth thickness T5 smaller than the fourth thickness T4. The inner spacer 220 may have the third thickness T3, which is the same as that before the wet etching process and/or the dry etching process.

Referring to FIG. 27, processes substantially the same as or similar to those described with reference to FIGS. 1 to 4 may be performed to from the gate structure 300 filling the second opening 250.

In an implementation, the gate structure 300 may have a sixth thickness T6 which is greater than the third thickness T3 of the inner spacer 220, the fourth thickness T4 of the central portion of the first semiconductor pattern 126a, and the fifth thickness T5 of the central portion of each of the second and third semiconductor patterns 126b and 126c.

Figure 28:
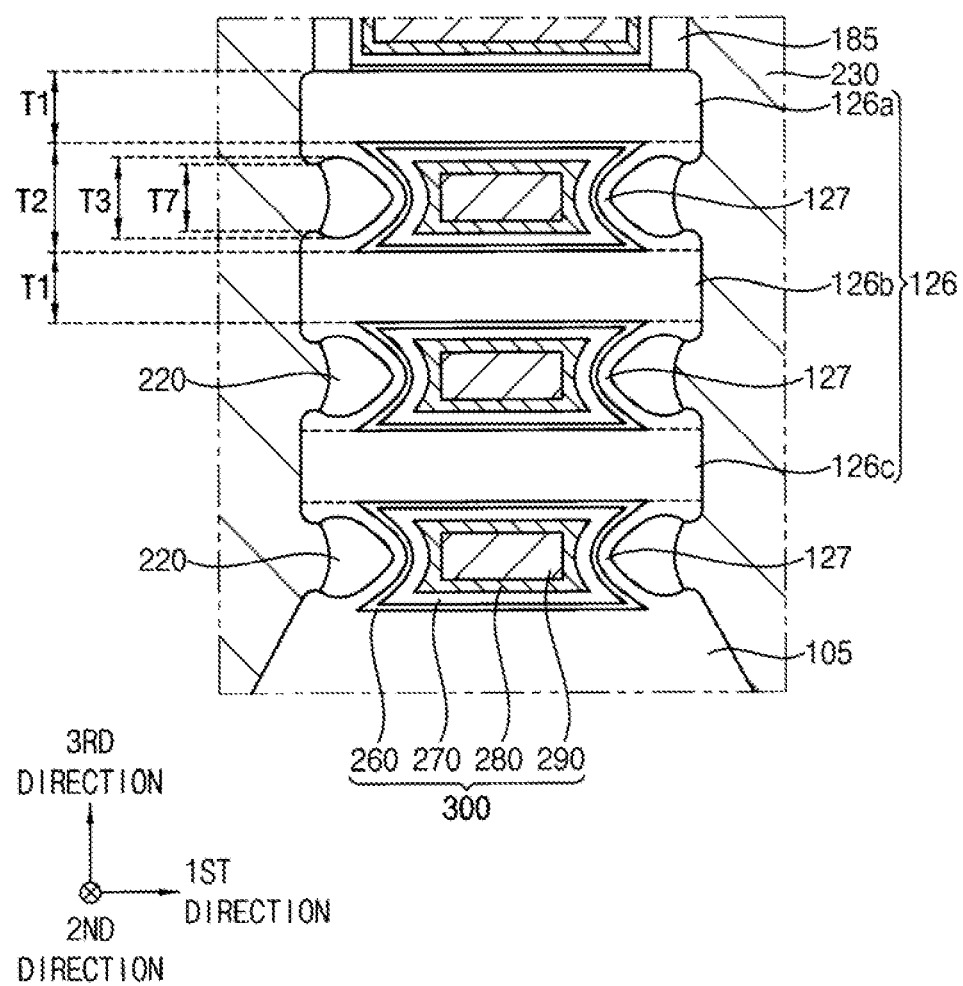
FIGS. 28 and 29 are cross-sectional views illustrating semiconductor devices in accordance with example embodiments.
Figure 29:
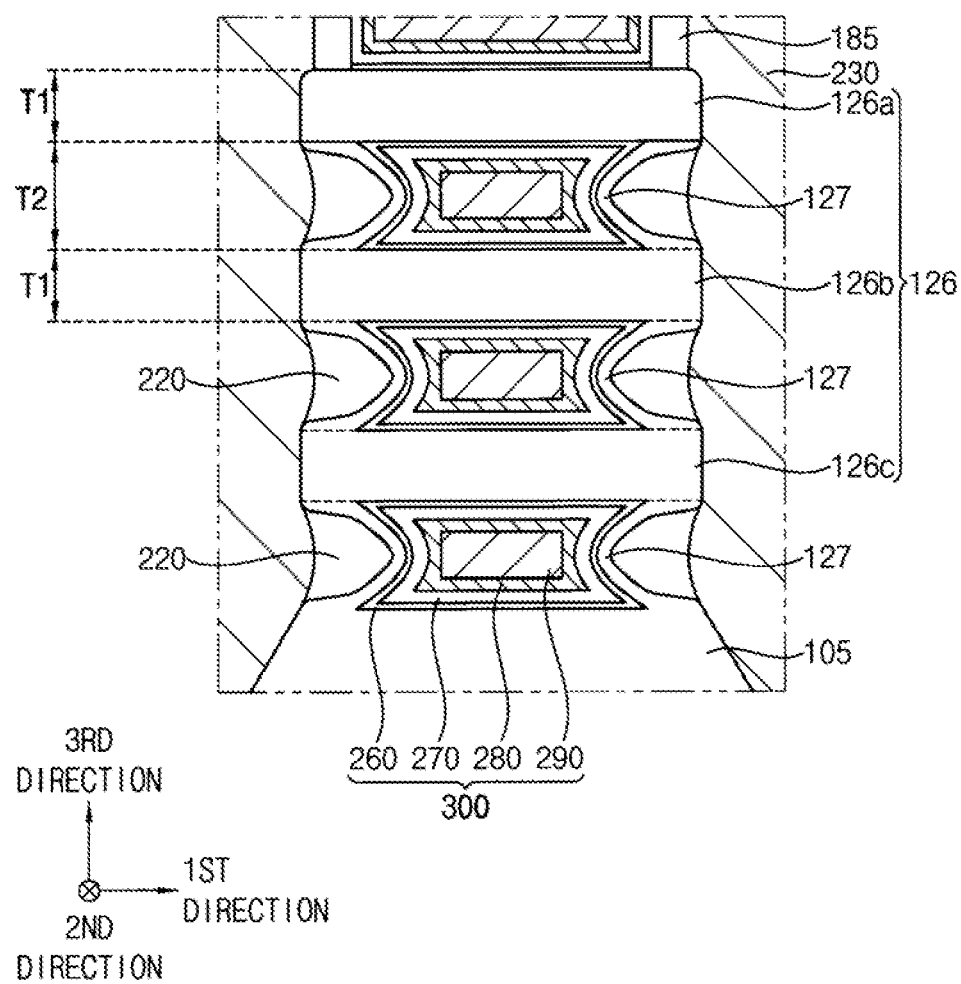

FIGS. 28 and 29 are cross-sectional views illustrating semiconductor devices in accordance with example embodiments, and are enlarged cross-sectional views of regions X of the cross-sectional view taken along the line B-B' of FIG. 1. The semiconductor devices are substantially the same or similar to the semiconductor devices illustrated with reference to FIGS. 1 to 4 except for shapes of semiconductor patterns, and like reference numerals refer to like elements, and repeated descriptions thereon may be omitted herein.

Referring to FIG. 28, a portion of the channel connection portion 127 contacting the source/drain layer 230 may have thickness in the third direction greater than that of other portions of the channel connection portion 127.

In an implementation, the first SEG process may be performed more on a portion of the preliminary semiconductor pattern 124 exposed by the first opening 190 than on a portion of the preliminary semiconductor pattern 124 exposed by the first recess 200, so that the portion of the semiconductor pattern 126 contacting the source/drain layer 230 may have the relatively large thickness.

In an implementation, a cross-section in the first direction of the channel connection portion 127 may have a shape of a C or reversed C in which ends of the C have a relatively larger thickness.

In an implementation, an outer sidewall of the inner spacer 220 contacting the source/drain layer 230 may have a seventh thickness T7 (e.g., in the third direction) smaller than the third thickness T3, which is a maximum thickness of the inner spacer 220.

Referring to FIG. 29, a portion of the channel connection portion 127 contacting the source/drain layer 230 may have thickness in the third direction smaller than that of other portions of the channel connection portion 127.

In an implementation, the first SEG process may be performed more on a portion of the preliminary semiconductor pattern 124 exposed by the first recess 200 than on a portion of the preliminary semiconductor pattern 124 exposed by the first opening 190, so that the portion of the semiconductor pattern 126 contacting the source/drain layer 230 may have the relatively small thickness.

In an implementation, a cross-section in the first direction of the channel connection portion 127 may have a shape of a C or reversed C in which ends of the C have a relatively smaller thickness.

In an implementation, the outer sidewall of the inner spacer 220 contacting the source/drain layer 230 may have a thickness substantially equal to the second thickness T2 of the portion of the gate structure 300 between the semiconductor patterns 126. In an implementation, a portion of the channel connection portion 127 contacting the semiconductor pattern 126 may have a thickness in the third direction that may increase as it becomes more distant from the source/drain layer 230 (e.g., moving inwardly in the first direction).

Figure 30:
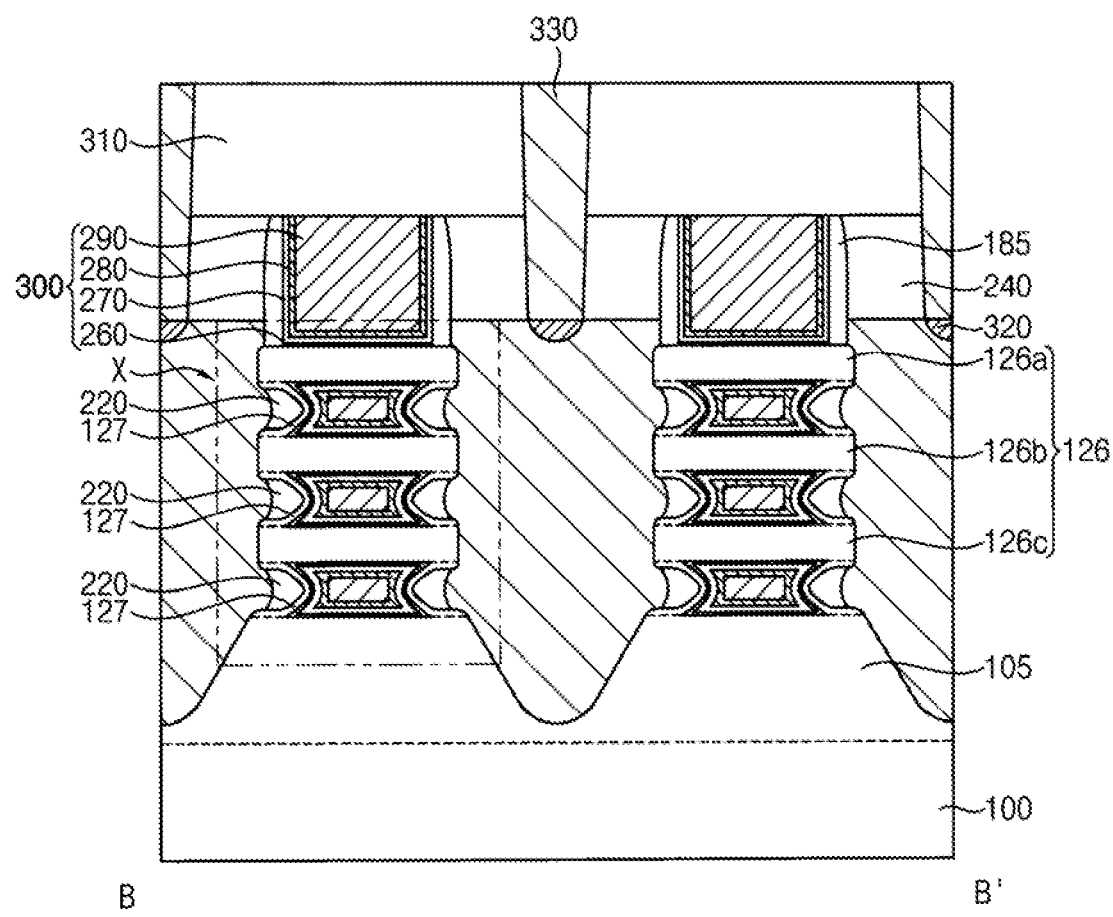
FIGS. 30 and 31 are cross-sectional views illustrating semiconductor devices in accordance with example embodiments.
Figure 30:
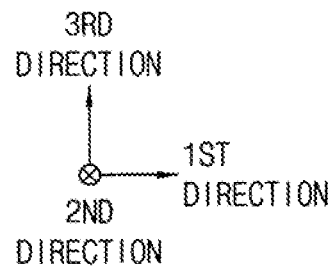
Figure 31:
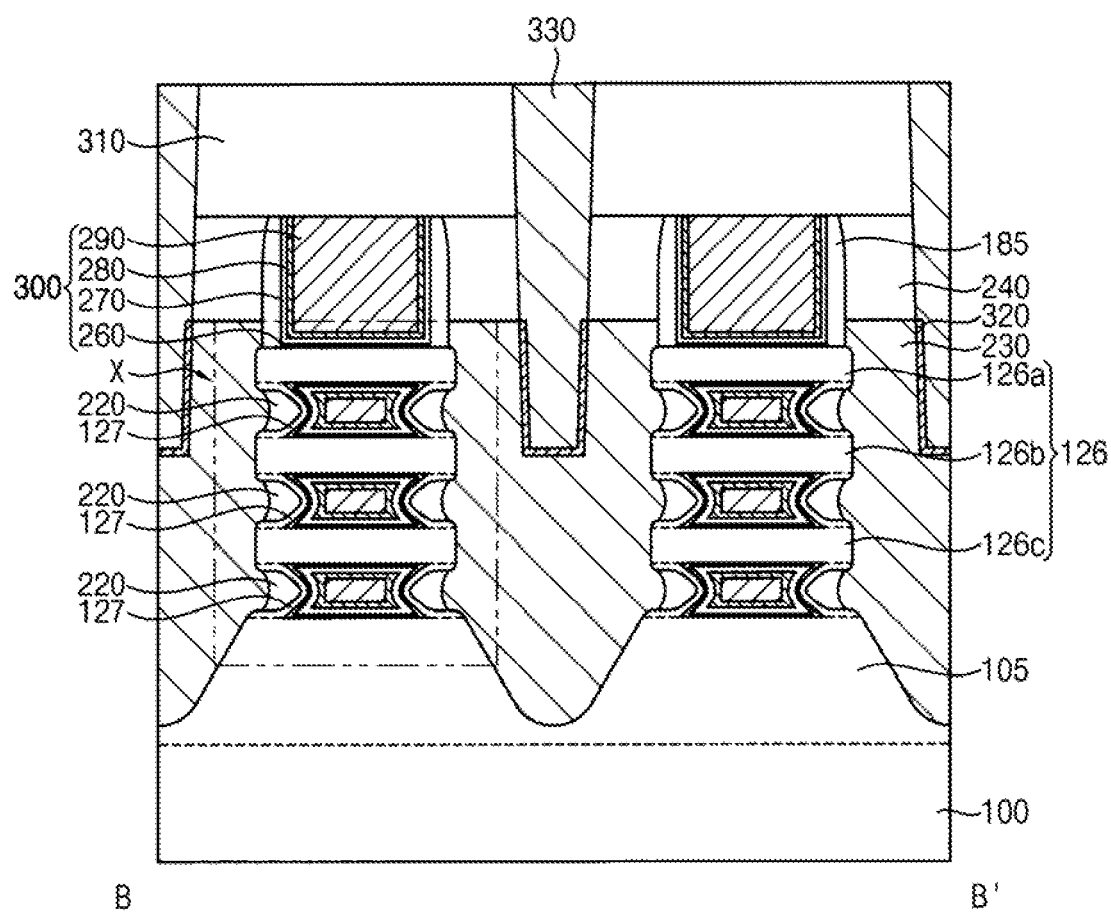

FIGS. 30 and 31 are cross-sectional views illustrating semiconductor devices in accordance with example embodiments, and are cross-sectional views taken along the line B-B' of FIG. 1. This semiconductor devices may be substantially the same as or similar to the semiconductor devices illustrated with reference to FIGS. 1 to 4 except that a metal silicide pattern and a contact plug are further formed on the source/drain layer, and thus like reference numerals refer to like elements, and repeated descriptions thereon may be omitted herein.

Referring to FIG. 30, a second insulating interlayer 310 may be formed on the gate structure 300 and the insulation layer 240, a contact hole may be formed through the insulation layer 240 and the second insulating interlayer 310 to expose an upper surface of the source/drain layer 230, and a contact plug 330 may be formed to fill the contact hole.

In an implementation, a plurality of contact plugs 330 may be formed along a first direction.

A metal silicide pattern 320 may be further formed on the source/drain layer 230. In an implementation, after forming a metal layer on the upper surface of the source/drain layer 230 exposed by the contact hole, a sidewall of the insulation layer 240, and a sidewall and an upper surface of the second insulating interlayer 310, a heat treatment process may be performed on the metal layer to form the metal silicide pattern 320 on the source/drain layer 230.

In an implementation, the metal silicide pattern 320 may include, e.g., nickel silicide, cobalt silicide, titanium silicide, or the like, and the contact plug 330 may include, e.g., a metal, a metal nitride, and/or polysilicon doped with impurities.

In an implementation, the contact plug 330 may have a structure in which a conductive pattern and a barrier pattern covering a sidewall thereof are stacked. The conductive pattern may include, e.g., a metal such as copper, tungsten, or aluminum. The barrier pattern may include, e.g., a metal such as titanium or tantalum, or a metal nitride such as titanium nitride or tantalum nitride.

In an implementation, as illustrated in FIG. 30, a lower (e.g., substrate 100—facing) surface of the contact plug 330 may be at the same height as the upper surface of the source/drain layer 230. In an implementation, the contact plug 330 may be formed to extend to have various depths in the third direction, so that the lower surface of the contact plug 330 may be formed to be lower than the upper surface of the source/drain layer 230.

Referring to FIG. 31, the lower surface of the contact plug 330 may be lower than a lower surface of the first semiconductor pattern 126a and higher than an upper surface of the third semiconductor pattern 126c, and, for example, may be formed at a height between lower and upper surfaces of the second semiconductor pattern 126b.

In an implementation, the lower surface of the contact plug 330 may be formed at a height between the lower surface of the first semiconductor pattern 126a and the upper surface of the second semiconductor pattern 126b, or between the lower surface of the second semiconductor pattern 126b and the upper surface of the third semiconductor pattern 126c.

In an implementation, as illustrated in FIG. 31, the metal silicide pattern 320 on the source/drain layer 230 may have a cylindrical shape. In an implementation, the metal silicide pattern 320 may have a pillar shape.

By way of summation and review, an inner spacer layer for forming the inner spacer may be formed to completely fill the space between the gate structure and the source/drain layer between neighboring ones of the plurality of channels. If the inner spacer layer has a thick thickness in order to completely fill the space, a residue may remain when removing the inner spacer layer.

One or more embodiments may provide a semiconductor device having a plurality of channels vertically stacked.

Example embodiments provide a semiconductor device having improved electrical characteristics.

In a method of manufacturing a semiconductor device according to example embodiments, a selective epitaxial growth (SEG) process may be further performed on surfaces of the channels in order to decrease a thickness of a recess in which an inner spacer is formed between the channels. Accordingly, even if an inner spacer layer for forming the inner spacer is provided in a relatively small amount on an active pattern, the inner spacer layer may be formed to completely fill the recess between the channels, and a residue may be completely removed so as not to remain when the inner spacer layer is removed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    an active pattern on a substrate, the active pattern extending lengthwise in a first direction parallel to an upper surface of the substrate;
    a gate structure on the active pattern, the gate structure extending lengthwise in a second direction parallel to the upper surface of the substrate and crossing the first direction;
    channels spaced apart from each other along a third direction perpendicular to the upper surface of the substrate, each of the channels extending lengthwise through the gate structure along the first direction;
    a source/drain layer on a portion of the active pattern adjacent to the gate structure in the first direction, the source/drain layer contacting the channels;
    inner spacers between the gate structure and the source/drain layer, the inner spacers contacting the source/drain layer; and
    channel connection portions between each of the inner spacers and the gate structure, the channel connection portions connecting the channels with each other.

2. The semiconductor device as claimed in claim 1, wherein each of the inner spacers has a shape protruding inwardly toward a center of the gate structure in the first direction.

3. The semiconductor device as claimed in claim 2, wherein each of the channel connection portions covers an inner sidewall, an upper surface, and a lower surface of a corresponding one of the inner spacers.

4. The semiconductor device as claimed in claim 3, wherein each of the channel connection portions directly contacts the source/drain layer.

5. The semiconductor device as claimed in claim 1, wherein the gate structure includes an interface pattern, a gate insulating pattern, a work function control pattern, and a gate electrode sequentially stacked from an surface of each of the channels, an upper surface of the active pattern, and an inner sidewall of the channel connection portion.

6. The semiconductor device as claimed in claim 5, wherein:
    the interface pattern includes silicon oxide, and
    the gate insulating pattern includes a metal oxide.

7. The semiconductor device as claimed in claim 5, further comprising a gate spacer covering a sidewall of a portion of the gate structure on an uppermost one of the channels,
    wherein the interface pattern is not formed on an inner sidewall of the gate spacer.

8. The semiconductor device as claimed in claim 7, wherein each of the channels extends outwardly beyond the gate spacer toward the source/drain layer in a plan view.

9. The semiconductor device as claimed in claim 1, wherein the channels and the channel connection portions each include single crystalline silicon.

10. The semiconductor device as claimed in claim 1, wherein the inner spacers include silicon nitride, silicon carbonitride, silicon boronitride, or silicon oxycarbonitride.

11. The semiconductor device as claimed in claim 1, wherein a portion of the gate structure between the channels has a thickness in the third direction greater than a thickness in the third direction of a corresponding one of the inner spacers adjacent thereto in the first direction.

12. The semiconductor device as claimed in claim 1, wherein each of the inner spacers has a thickness in the third direction that gradually increases toward the source/drain layer in the first direction.

13. The semiconductor device as claimed in claim 1, wherein a thickness, in the third direction, of each of the inner spacers gradually increases to a maximum thickness and then gradually decreases toward the source/drain layer in the first direction.

14. A semiconductor device, comprising:
an active pattern on a substrate, the active pattern extending lengthwise in a first direction parallel to an upper surface of the substrate;
a gate structure on the active pattern, the gate structure extending lengthwise in a second direction parallel to the upper surface of the substrate and crossing the first direction;
channels spaced apart from each other along a third direction perpendicular to the upper surface of the substrate, each of the channels extending lengthwise through the gate structure along the first direction;
a source/drain layer on a portion of the active pattern portion adjacent to the gate structure in the first direction, the source/drain layer contacting the channels; and
a channel connection portion and an inner spacer sequentially stacked along the first direction between the gate structure and the source/drain layer, the channel connection portion including a semiconductor material and the inner spacer including silicon nitride,
wherein the gate structure includes an interface pattern, a gate insulating pattern and a gate electrode sequentially stacked along the first direction from the channel connection portion, the interface pattern including silicon oxide, the gate insulating pattern including a metal oxide, and the gate electrode including a metal.

15. The semiconductor device as claimed in claim 14, wherein the channel connection portion connects:
the channels with each other, and
a lowermost one of the channels with the active pattern.

16. The semiconductor device as claimed in claim 14, wherein the channel connection portion includes the same semiconductor material as the channels.

17. The semiconductor device as claimed in claim 14, wherein the inner spacer has a shape protruding inwardly toward a center of the gate structure in the first direction.

18. The semiconductor device as claimed in claim 17, wherein the channel connection portion covers an inner sidewall, an upper surface, and a lower surface of the inner spacer.

19. The semiconductor device as claimed in claim 18, wherein the channel connection portion directly contacts the source/drain layer.

20. A semiconductor device, comprising:
an active pattern on a substrate, the active pattern extending lengthwise in a first direction parallel to an upper surface of the substrate;
channels on the active pattern, the channels being spaced apart from each other along a third direction perpendicular to the upper surface of the substrate;
a gate structure extending lengthwise on the active pattern in a second direction parallel to the upper surface of the substrate and crossing the first direction, the gate structure at least partially covering each of the channels;
source/drain layers at respective opposite sides of the gate structure in the first direction, each of the source/drain layers contacting the channels;
inner spacers between the active pattern and a lowermost one of the channels and between the channels, respectively, the inner spacers contacting the source/drain layers;
gate spacers covering respective opposite sidewalls of a portion of the gate structure on an uppermost one of the channels; and
channel connection portions between the gate structure and a corresponding one of the inner spacers, the channel connection portions connecting the active pattern and the lowermost one of the channels, and connecting the channels with each other, and the channel connection portions covering an inner sidewall, an upper surface, and a lower surface of a corresponding one of the inner spacers,
wherein the gate structure includes an interface pattern, a gate insulating pattern, a gate electrode sequentially stacked from an surface of each of the channels, an upper surface of the active pattern and an inner sidewall of the channel connection portion, the interface pattern including a silicon oxide, the gate insulating pattern including a metal oxide, and the gate electrode including a metal.

* * * * *